United States Patent
Shin et al.

(10) Patent No.: US 12,367,810 B2
(45) Date of Patent: Jul. 22, 2025

(54) DISPLAY DEVICE AND MANUFACTURING METHOD FOR THE SAME

(71) Applicant: Samsung Display Co., LTD., Yongin-si (KR)

(72) Inventors: Dong Hee Shin, Yongin-si (KR); No Kyung Park, Yongin-si (KR); Sun Kwun Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 32 days.

(21) Appl. No.: 18/328,055

(22) Filed: Jun. 2, 2023

(65) Prior Publication Data
US 2024/0078968 A1     Mar. 7, 2024

(30) Foreign Application Priority Data
Sep. 6, 2022    (KR) ........................ 10-2022-0112949

(51) Int. Cl.
*G09G 3/32*        (2016.01)
*H01L 25/00*      (2006.01)
(Continued)

(52) U.S. Cl.
CPC ............. *G09G 3/32* (2013.01); *H01L 25/075* (2013.01); *H01L 25/0753* (2013.01); *H01L 25/167* (2013.01); *H01L 25/50* (2013.01); *H10D 86/021* (2025.01); *H10D 86/441* (2025.01); *H10D 86/471* (2025.01); *H10D 86/481* (2025.01); *H10D 86/60* (2025.01); *H10H 20/01* (2025.01); *H10H 20/83* (2025.01); *H10H 20/831* (2025.01); *H10H 20/857* (2025.01); *H10H 29/142* (2025.01); *G09G 2300/0842* (2013.01);
(Continued)

(58) Field of Classification Search
CPC ............ G09G 3/32; G09G 2300/0842; G09G 2310/0267; H01L 25/075; H01L 25/0753; H01L 25/167; H01L 25/50; H01L 27/124; H01L 27/1251; H01L 27/1255; H01L 27/1259; H01L 27/156; H01L 33/005; H01L 33/36; H01L 33/38; H01L 33/62; H01L 2933/0016; H01L 2933/0066; H10K 59/122; H10K 59/131
See application file for complete search history.

(56) References Cited

U.S. PATENT DOCUMENTS 10,084,031 B2    9/2018   Park et al.
2021/0408104 A1*   12/2021   Lee ..................... H01L 25/0753

FOREIGN PATENT DOCUMENTS

KR    10-2018-0036818      4/2018

* cited by examiner

*Primary Examiner* — Nitin Patel
*Assistant Examiner* — Cory A Almeida
(74) *Attorney, Agent, or Firm* — KILE PARK REED & HOUTTEMAN PLLC

(57) ABSTRACT

A display device includes pixels disposed on a base layer, each of the pixels including electrodes and a light emitting element disposed on the electrodes, and scan lines that supply a scan signal to the pixels. The pixels include a first pixel and a second pixel disposed adjacent to the first pixel. The scan lines include a first pixel scan line that supplies a first scan signal to the first pixel, and a second pixel scan line that supplies a second scan signal to the second pixel. The electrodes include a first electrode and a second electrode, which are spaced from each other. The second pixel scan line is electrically connected to a second electrode of the first pixel.

22 Claims, 19 Drawing Sheets

(51) Int. Cl.
*H01L 25/075* (2006.01)
*H01L 25/16* (2023.01)
*H10D 86/01* (2025.01)
*H10D 86/40* (2025.01)
*H10D 86/60* (2025.01)
*H10H 20/01* (2025.01)
*H10H 20/83* (2025.01)
*H10H 20/831* (2025.01)
*H10H 20/857* (2025.01)
*H10H 29/14* (2025.01)
*H10K 59/122* (2023.01)
*H10K 59/131* (2023.01)

(52) U.S. Cl.
CPC ... *G09G 2310/0267* (2013.01); *H10H 20/032* (2025.01); *H10H 20/0364* (2025.01); *H10K 59/122* (2023.02); *H10K 59/131* (2023.02)

DISPLAY DEVICE AND MANUFACTURING METHOD FOR THE SAME

CROSS-REFERENCE TO RELATED APPLICATION(S)

This application claims priority to and benefits of Korean patent application No. 10-2022-0112949 under 35 U.S.C § 119, filed on Sep. 6, 2022, in the Korean Intellectual Property Office (KIPO), the entire contents which are incorporated herein by reference.

BACKGROUND

1. Technical Field

The disclosure generally relates to a display device and a manufacturing method of the same.

2. Description of the Related Art

Recently, as an interest in information displays is increased, research and development of display devices have been continuously conducted.

SUMMARY

Embodiments provide a display device and a manufacturing method of the same, in which the reliability of electrical signals is improved in the display device.

However, embodiments of the disclosure are not limited to those set forth herein. The above and other embodiments will become more apparent to one of ordinary skill in the art to which the disclosure pertains by referencing the detailed description of the disclosure given below.

In accordance with an aspect of the disclosure, a display device may include pixels disposed on a base layer, each of the pixels including electrodes and a light emitting element disposed on the electrodes, and scan lines that supply a scan signal to the pixels. The pixels may include a first pixel and a second pixel disposed adjacent to the first pixel. The scan lines may include a first pixel scan line that supplies a first scan signal to the first pixel, and a second pixel scan line that supplies a second scan signal to the second pixel. The electrodes may include a first electrode and a second electrode, which are spaced from each other. The second pixel scan line may be electrically connected to a second electrode of the first pixel.

The light emitting element may be aligned between the first electrode and the second electrode.

The display device may further include a first power line that supplies a first power to the light emitting element, and a second power line that supplies a second power different from the first power to the light emitting element. The second power line may not be electrically connected to the second electrode.

The electrodes may further include a third electrode. The second electrode may be disposed on a side of the first electrode, and the third electrode may be disposed on another side of the first electrode. The second power line may supply the second power to the first electrode, and the second power line may not supply the second power to the second electrode.

Each of the pixels may further include a pixel circuit including a driving transistor. The second electrode may overlap a gate electrode of the driving transistor in a plan view.

The second electrode may entirely cover the gate electrode of the driving transistor.

The driving transistor may include an active layer. The active layer may include a non-covering active layer not overlapping the gate electrode. The second electrode may overlap the non-covering active layer in a plan view.

The pixel circuit may further include a storage capacitor including a first capacitor electrode and a second capacitor electrode. The second electrode may overlap the first capacitor electrode and the second capacitor electrode in a plan view.

The second electrode may entirely cover the first capacitor electrode and the second capacitor electrode.

The electrodes may further include an extension electrode pattern integrally formed with the second electrode.

An extension electrode pattern of the first pixel may be electrically connected to the second pixel scan line through a scan contact part, and may be physically separated from a second electrode of the second pixel.

The extension electrode pattern and the electrodes may extend in a same direction.

Each of the pixels may further include an anode connection electrode electrically connected to a first end portion of the light emitting element, and a cathode connection electrode electrically connected to a second end portion of the light emitting element.

Each of the pixels may further include a pixel circuit including a driving transistor. A source electrode, a drain electrode, and a gate electrode of the driving transistor may be disposed in a same layer.

In accordance with another aspect of the disclosure, a method for manufacturing a display device including a first pixel and a second pixel disposed adjacent to the first pixel may include: patterning, on a base layer, a pixel circuit, a scan line, and a power line, the pixel circuit including a driving transistor and the power line including a first power line and a second power line; patterning an alignment electrode layer on the base layer; and disposing light emitting elements on the alignment electrode layer. The patterning of the alignment electrode layer may include forming a first electrode and a second electrode spaced apart from the first electrode in a first direction, and a second electrode of the first pixel may be electrically connected to a scan line of the second pixel.

The patterning of the alignment electrode layer may further include electrically connecting the second electrode of the first pixel to the scan line of the second pixel, and electrically connecting the second electrode of the first pixel to the second power line.

The patterning of the alignment electrode layer may further include covering, by the second electrode, a gate electrode of the driving transistor.

The driving transistor may include an active layer. The active layer may include a non-covering active layer not overlapping the gate electrode of the driving transistor in a plan view. The patterning of the alignment electrode layer may further include covering, by the second electrode, the non-covering active layer.

The method may further include removing a portion of the alignment electrode layer. The removing of the portion of the alignment electrode layer may include electrically separating the second electrode and the second power line from each other.

The second electrode of the first pixel may be electrically connected to the scan line of the second pixel through an extension electrode pattern of the first pixel. The method may further include removing a portion of the alignment electrode layer. The removing of the portion of the alignment electrode layer may include electrically separating the extension electrode pattern of the first pixel and a second electrode of the second pixel from each other.

The disposing of the light emitting elements may include supplying an alignment signal to the alignment electrode layer and aligning the light emitting elements, based on an electric field formed by the alignment signal.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be more thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals and reference characters refer to like elements throughout the application.

DETAILED DESCRIPTION OF THE EMBODIMENTS

Figure 1:
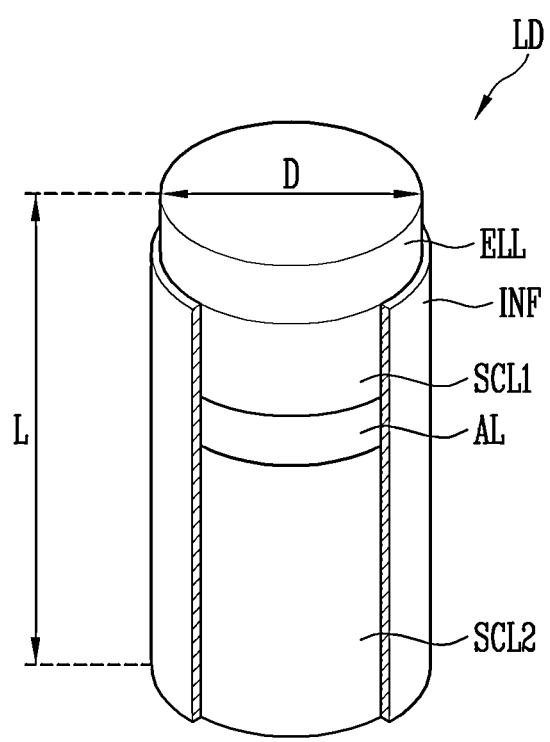
FIG. 1 is a schematic perspective view illustrating a light emitting element in accordance with an embodiment of the disclosure.

The disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The disclosure generally relates to a display device and a manufacturing method of the same. Hereinafter, a display device and a manufacturing method of the same in accordance with an embodiment of the disclosure will be described with reference to the accompanying drawings.

Figure 2:
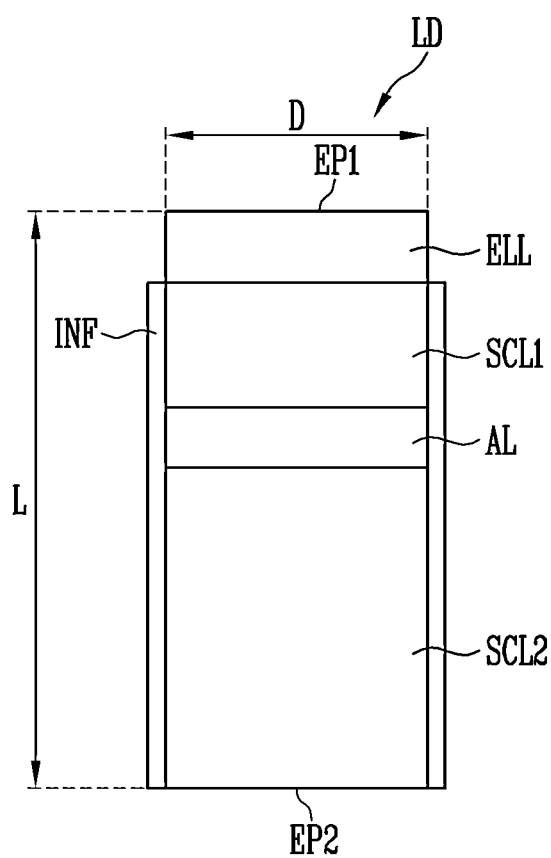
FIG. 2 is a schematic cross-sectional view illustrating the light emitting element in accordance with an embodiment of the disclosure.

First, a light emitting element LD in accordance with an embodiment of the disclosure will be described with reference to FIGS. 1 and 2. FIG. 1 is a schematic perspective view illustrating a light emitting element in accordance with an embodiment of the disclosure. FIG. 2 is a schematic cross-sectional view illustrating the light emitting element shown in FIG. 1.

The light emitting element LD may emit light. The light emitting element LD may include a first semiconductor layer SCL1, a second semiconductor layer SCL2, and an active layer AL disposed between the first semiconductor layer SCL1 and the second semiconductor layer SCL2. In embodiments, the first semiconductor layer SCL1, the active layer AL, and the second semiconductor layer SCL2 may be sequentially stacked in a length L direction of the light emitting element LD. In embodiments, the light emitting element LD may further include an electrode layer ELL and an insulative film INF.

The light emitting element LD may have various shapes. For example, the light emitting element LD may have a pillar shape extending in a direction. The pillar shape may include a rod-like shape or bar-like shape, which is long in the length L direction (i.e., its aspect ratio is greater than 1), such as a cylinder or a polyprism, and the cross-sectional shape of the light emitting element LD is not particularly limited. However, the disclosure is not limited to the above-described example.

The light emitting element LD may have a first end portion EP1 and a second end portion EP2. In embodiments, the first semiconductor layer SCL1 may be disposed adjacent to the first end portion EP1 of the light emitting element LD, and the second semiconductor layer SCL2 may be disposed adjacent to the second end portion EP2 of the light emitting element LD. The electrode layer ELL may be disposed adjacent to the first end portion EP1.

The light emitting element LD may be manufactured by etching sequentially stacked semiconductor layers. The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may include a first conductivity type semiconductor. The first semiconductor layer SCL1 may be disposed on the active layer AL, and include a semiconductor layer having a type different from a type of the second semiconductor layer SCL2. For example, the first semiconductor layer SCL1 may include a P-type semiconductor layer. For example, the first semiconductor layer SCL1 may include at least one semiconductor material selected from the group consisting of InAlGaN, GaN, AlGaN, InGaN, AlN, and InN, and include a P-type semiconductor layer doped with a first conductivity type dopant such as Ga, B or Mg. However, the disclosure is not limited to the above-described example. The first semiconductor layer SCL1 may include various materials.

The active layer AL may be disposed between the first semiconductor layer SCL1 and the second semiconductor layer SCL2. The active layer AL may have a single-quantum well structure or a multi-quantum well structure. The position of the active layer AL is not limited to a specific example, and may be variously changed according to the kind of the light emitting element LD.

A clad layer (not illustrated) doped with a conductive dopant may be formed on a side and/or another side of the active layer AL. For example, the clad layer may include at least one of AlGaN and InAlGaN. However, the disclosure is not necessarily limited to the above-described example.

The second semiconductor layer SCL2 may be a second conductivity type semiconductor. The second semiconductor layer SCL2 may be disposed on the active layer AL, and include a semiconductor layer having a type different from the type of the first semiconductor layer SCL1. For example, the second semiconductor layer SCL2 may include an N-type semiconductor layer. For example, the second semiconductor layer SCL2 may include at least one semiconductor material selected from the group consisting of InAlGaN, GaN, AlGaN, InGaN, AlN, and InN, and include an N-type semiconductor layer doped with a second conductivity type dopant such as Si, Ge or Sn. However, the disclosure is not limited to the above-described example. The second semiconductor layer SCL2 may include various materials.

In case that a voltage which is a threshold voltage or higher is applied to the first end portion EP1 and the second end portion EP2 of the light emitting element LD, electron-hole pairs may be combined in the active layer AL, and the light emitting element LD may emit light. The light emission of the light emitting element LD may be controlled by using such a principle, so that the light emitting element LD can be used as a light source for various devices.

The insulative film INF may be disposed on a surface of the light emitting element LD. The insulative film INF may surround an outer surface of the active layer AL. The insulative film INF may surround a portion of each of the first semiconductor layer SCL1 and the second semiconductor layer SCL2. The insulative film INF may have a single-layer or a multi-layer structure.

The insulative film INF may expose the first end portion EP1 and the second end portion EP2 of the light emitting element LD, which have different polarities. For example, the insulative film INF may expose an end of each of the electrode layer ELL and the second semiconductor layer SCL2, which are respectively adjacent to the first end portion EP1 and the second end portion EP2 of the light emitting element LD.

The insulative film INF may include at least one selected from the group consisting of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

In accordance with an embodiment, the insulative film INF may ensure the electrical stability of the light emitting element LD. Also, the insulative film INF may minimize a surface defect of the light emitting element LD, thereby improving the lifetime and efficiency of the light emitting element LD. In case that multiple light emitting elements LD are densely disposed, the insulative film INF may prevent a source circuit defect between the light emitting elements LD.

The electrode layer ELL may be disposed on the first semiconductor layer SCL1. The electrode layer ELL may be disposed adjacent to the first end portion EP1. The electrode layer ELL may be electrically connected to the first semiconductor layer SCL1.

A portion of the electrode layer ELL may be exposed. For example, the insulative film INF may expose a surface of the electrode layer ELL. The electrode layer ELL may be exposed in an area corresponding to the first end portion EP1.

In embodiments, a side surface of the electrode layer ELL may be exposed. For example, the insulative film INF may not cover at least a portion of the side surface of the electrode layer ELL and may cover a side surface of each of the first semiconductor layer SCL1, the active layer AL, and the second semiconductor layer SCL2. Thus, the electrode layer ELL disposed adjacent to the first end portion EP1 may be readily connected to another component. In embodiments, the insulating layer INF may expose the side surface of the electrode layer ELL and a portion of a side surface of the first semiconductor layer SCL1 and/or the second semiconductor layer SCL2.

In accordance with an embodiment, the electrode layer ELL may be an ohmic contact electrode. However, the disclosure is not necessarily limited. For example, the electrode layer ELL may be a Schottky contact electrode.

In accordance with an embodiment, the electrode layer ELL may include at least one selected from the group consisting of chromium (Cr), titanium (Ti), aluminum (Al), gold (Au), nickel (Ni), and an oxide or alloy thereof. However, the disclosure is not necessarily limited to the above-described example. In embodiments, the electrode layer ELL may be substantially transparent. For example, the electrode layer ELL may include indium tin oxide (ITO). Accordingly, the electrode layer EEL may transmit emitted light therethrough.

The structure, shape, and the like of the light emitting element LD are not limited to the above-described example. In embodiments, the light emitting element LD may have various structures and various shapes. For example, the light emitting element LD may include an additional electrode layer which is disposed on a surface of the second semiconductor layer SCL2 and is disposed adjacent to the second end portion EP2.

Figure 3:
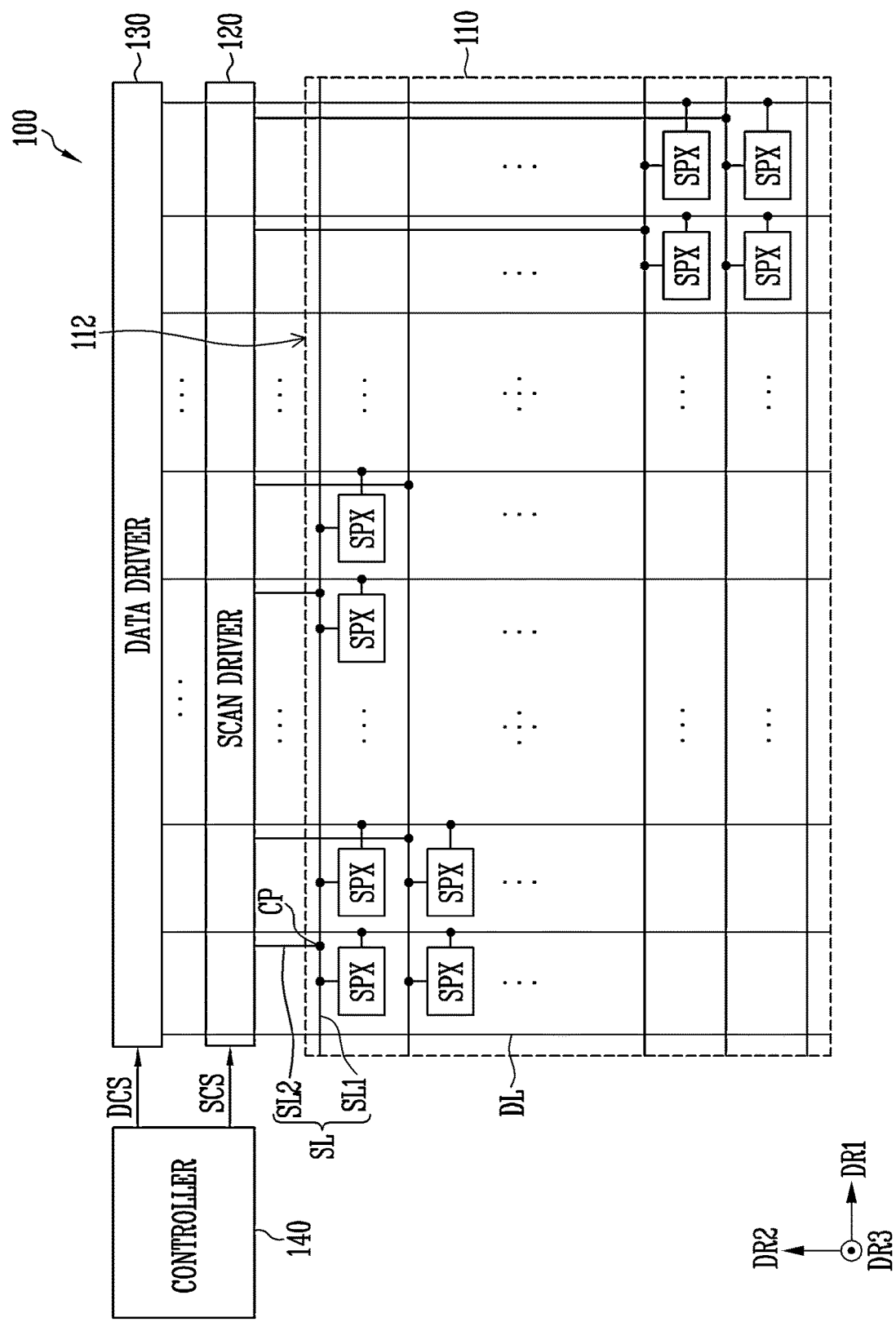
FIG. 3 is a schematic block diagram illustrating a display device in accordance with an embodiment of the disclosure.

A display device 100 in accordance with an embodiment of the disclosure will be described with reference to FIG. 3. FIG. 3 is a schematic block diagram illustrating a display device in accordance with an embodiment of the disclosure.

The display device 100 may emit light. The display device 100 may be an electronic device using the light emitting element LD as a light source. In embodiments, the display device 100 may include a unit pixel 110, a scan driver 120, a data driver 130, and a controller 140.

The unit pixel 110 may include multiple sub-pixels SPX connected to scan lines SL and data lines DL. In embodiments, at least one of the sub-pixels SPX may form (or constitute) a pixel (see 'PXL' shown in FIG. 8) (or a unit pixel 110). For example, the sub-pixel SPX may include a first sub-pixel (see 'SPX1' shown in FIG. 8) emitting light of a first color (e.g., red), a second sub-pixel (see 'SPX2' shown in FIG. 8) emitting light of a second color (e.g., green), and a third sub-pixel (see 'SPX3' shown in FIG. 8) emitting light of a third color (e.g., blue). However, the disclosure is not limited to the above-described example.

The scan driver 120 may be disposed on a side 112 of the unit pixel 110. The scan driver 120 may receive a first control signal SCS from the controller 140. The scan driver 120 may provide a scan signal to the sub-pixel SPX. The scan driver 120 may supply the scan signal to the scan lines SL in response to the first control signal SCS. For example, the scan signal may be provided to the sub-pixel SPX through a first scan line SL1 extending in a first direction DR1 and a second scan line SL2 extending in a second direction DR2.

The first control signal SCS may be a signal for controlling a driving timing of the scan driver 120. The first control signal SCS may include a scan start signal for the scan signal and multiple clock signals. The scan signal may be set to a gate-on level corresponding to the type of a transistor to which the corresponding scan signal is supplied.

The data driver 130 may be disposed on the side 112 of the unit pixel 110. The data driver 130 may receive a second control signal DCS from the controller 140. The data driver 130 may provide a data signal to the sub-pixel SPX. The data driver 130 may supply the data signal to the data line DL in response to the second control signal DCS. For example, the second control signal DCS may be provided to the sub-pixel SPX through the data line DL.

The second control signal DCS may be a signal for controlling a driving timing of the data driver 130.

In accordance with an embodiment, the display device 100 may include a compensator (not shown). The compensator may receive a third control signal for sensing of the sub-pixels SPX and degradation compensation from the controller 140. The compensator may receive a sensing value (current or voltage information) received from the sub-pixel SPX through a sensing line ('SENL' shown in FIG. 4). The compensator may generate a compensation value for compensating for degradation of the sub-pixel SPX, based on the sensing value.

A single side driving structure may be provided, in which the scan driver 120 and the data driver 130 are disposed on the side 112 of the unit pixel 110. The scan driver 120 and the data driver 130 may be disposed on a same side of the unit pixel 110. For example, in case that the display device 100 includes four sides, the scan driver 120 and the data driver 130 may be disposed adjacent to one of the four sides.

In accordance with an embodiment, in order to form the single side driving structure of the display device 100, the scan line SL may include the first scan line SL1 and the second scan line SL2, which extend in different directions.

The first scan line SL1 may extend in the first direction DR1, and may be electrically connected to sub-pixels SPX of a pixel row corresponding thereto. The second scan line SL2 may extend in the second direction DR2, and may be electrically connected to the first scan line SL1 at a contact area CP. A scan signal supplied from the second scan line SL2 may be supplied to the sub-pixels SPX through the first scan line SL1.

The first scan line SL1 may be connected to at least one second scan line SL2. For example, referring to a pixel row illustrated on a top side of the unit pixel 110 shown in FIG. 3, the first scan line SL1 may be electrically connected to one of the second scan lines SL2 in an area, and be electrically connected to another one of the second scan lines SL2 in another area.

The data line DL may extend in a pixel column direction (e.g., the second direction DR2), and may be electrically connected to a sub-pixel SPX. The data line DL may supply a data signal to the sub-pixel SPX connected thereto.

A pixel row direction may be a horizontal direction, and may mean the first direction DR1. A pixel column direction may be a vertical direction, and may mean the second direction DR2. The pixel row may be defined by the first scan line SL1. The pixel row direction may be equal (or substantially parallel) to a direction in which the side 112 of the unit pixel 110, at which the scan driver 120 and the data driver 130 are disposed, extends.

Although FIG. 3 illustrates that the scan driver 120, the data driver 130, and the controller 140 are distinguished from one another, the disclosure is not limited thereto, and at least some of the scan driver 120, the data driver 130, and the controller 140 may be integrated into one module or one integrated circuit chip (IC chip).

Figure 4:
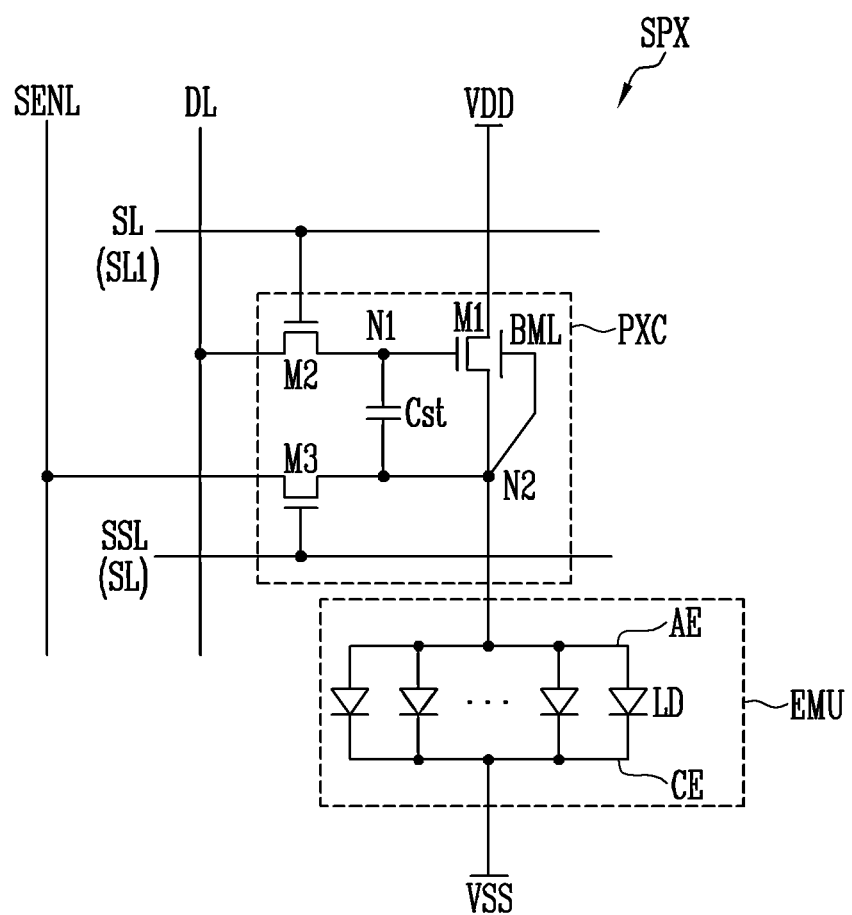
FIG. 4 is a schematic diagram of an equivalent circuit of a pixel included in a sub-pixel in accordance with an embodiment of the disclosure.

FIG. 4 is a schematic diagram of an equivalent circuit of a pixel included in a sub-pixel in accordance with an embodiment of the disclosure.

Referring to FIG. 4, the sub-pixel SPX may include a pixel circuit PXC. The pixel circuit PXC may drive a unit light emitting element EMU (or light emitting elements LD). Each of sub-pixels SPX forming one unit pixel 110 may include a pixel circuit PXC.

The sub-pixel SPX may be electrically connected to a scan lines SL, a data line DL, a first power line VDD, and a second power line VSS. The scan line SL in FIG. 4 may be the first scan line SL1 in FIG. 3. For convenience of description, the first scan line SL1 is designated and described as the scan line SL in FIG. 4.

The sub-pixel SPX may include the unit light emitting element EMU (or the light emitting elements LD) that emits light corresponding to a data signal provided from the data line DL.

The pixel circuit PXC may be disposed between the first power line VDD and the unit light emitting element EMU. The pixel circuit PXC may be electrically connected to the scan line SL to which a first scan signal is supplied and the data line DL to which a data signal is supplied. The pixel circuit PXC may be electrically connected to a control line SSL to which a second scan signal is supplied, and be electrically connected to a sensing line SENL connected to a reference power source (or initialization power source) or a sensing circuit. In embodiments, the second scan signal may be equal to or different from the first scan signal. In case that the second scan signal is equal to the first scan signal, the control line SSL may be integrated with the scan line SL.

The pixel circuit PXC may include at least one circuit element. For example, the pixel circuit PXC may include a first transistor M1, a second transistor M2, a third transistor M3, and a capacitor Cst.

The first transistor M1 may be electrically connected between the first power line VDD and a second node N2. The second node N2 may be a node at which the pixel circuit PXC and the unit light emitting element EMU are connected to each other. For example, the second node N2 may be a node at which an electrode (e.g., a drain electrode) of the first transistor M1 and an anode connection electrode AE of the unit light emitting element EMU are connected to each other. A gate electrode of the first transistor M1 may be electrically connected to a first node N1. The first transistor M1 may control a driving current supplied to the unit light emitting element EMU, corresponding to a voltage of the first node N1. The first transistor M1 may be a driving transistor.

In embodiments, in case that a portion of a lower auxiliary electrode layer BML is disposed on a lower portion of the first transistor M1, a back-biasing technique (or sync technique) may be applied, in which a threshold voltage of the first transistor M1 is moved in a negative direction or positive direction by applying a back-biasing voltage to the lower auxiliary electrode layer BML of the first transistor M1 in driving of the sub-pixel SPX.

The second transistor M2 may be electrically connected between the data line DL and the first node N1. A gate electrode of the second transistor M2 may be electrically connected to the scan line SL. The second transistor M2 may be turned on in case that the first scan signal having a gate-on voltage (e.g., a high level voltage) is supplied from the scan line SL, to electrically connect the data line DL and the first node N1 to each other.

A data signal of a corresponding frame may be supplied to the data line DL for each frame period. The data signal may be transferred to the first node N1 through the second transistor M2 during a period in which the first scan signal having the gate-on voltage is supplied. For example, the second transistor M2 may be a switching transistor for transferring each data signal to the sub-pixel SPX.

An electrode of the storage capacitor Cst may be electrically connected to the first node N1, and another electrode of the storage capacitor Cst may be electrically connected to the second node N2. The storage capacitor Cst may charge a voltage corresponding to the data signal supplied to the first node N1 during each frame period.

The third transistor M3 may be electrically connected between the second node N2 and the sensing line SENL. A gate electrode of the third transistor M3 may be connected to the control line SSL (or the scan line SL). The third transistor M3 may be turned on in case that the second scan signal (or the first scan signal) having the gate-on voltage (e.g., the high level voltage) is supplied from the control line SSL, to transfer, to the second node N2, a reference voltage (or initialization voltage) supplied from the sensing line SENL, or to transfer a voltage of the second node N2 to the sensing line SENL. The voltage of the second node N2, which is transferred to the sensing circuit through the sensing line SENL, may be provided to an external circuit (e.g., the controller 140) to be used for compensating for a characteristic deviation of sub-pixels SPX, and the like.

Although FIG. 4 illustrates that the transistors included in the pixel circuit PXC are all N-type transistors, the disclosure is not limited thereto. For example, at least one of the first, second, and third transistors M1, M2, and M3 may be changed to a P-type transistor. The structure and driving method of the sub-pixel SPX may be variously changed in embodiments.

The unit light emitting element EMU may include the anode connection electrode AE, a cathode connection electrode CE, and at least one light emitting element LD, which are electrically connected between the first power line VDD and the second power line VSS. For example, the unit light emitting element EMU may include the anode connection electrode AE connected to the first power line VDD through the first transistor M1, the cathode connection electrode CE connected to the second power line VSS, and the at least one light emitting elements LD connected between the anode connection electrode AE and the cathode connection electrode CE. In accordance with an embodiment, the unit light emitting element EMU may include multiple light emitting elements LD connected in parallel between the anode connection electrode AE and the cathode connection electrode CE.

A power of the first power line VDD and a power of the second power line VSS may have different potentials. For example, the power of the first power line VDD may be a high-potential pixel power, and the power of the second power line VSS may be a low-potential pixel power. A potential difference between the power of the first power line VDD and the power of the second power line VSS may be set equal to or higher than a threshold voltage of the light emitting elements LD.

The first power line VDD may be electrically connected to the first transistor M1. The second power line VSS may be electrically connected to the cathode connection electrode CE.

The light emitting elements LD may be connected in a forward direction between the first power line VDD and the second power line VSS to form effective light sources. These effective light sources may constitute the unit light emitting element EMU of the sub-pixel SPX.

The light emitting elements LD may emit light with a luminance corresponding to a driving current supplied through the pixel circuit PXC. The pixel circuit PXC may supply a driving current corresponding to a data signal to the unit light emitting element EMU during each frame period. The driving current supplied to the unit light emitting element EMU may be divided to flow through the light emitting elements LD. Accordingly, the unit light emitting element EMU may emit light with a luminance corresponding to the driving current while each light emitting element LD emits light with a luminance corresponding to a current flowing therethrough.

Although FIG. 4 illustrates that the sub-pixel SPX includes the unit light emitting element EMU having a parallel structure, the disclosure is not limited thereto. For example, the sub-pixel SPX may include a unit light emitting element EMU having a serial structure or a series/parallel structure. The unit light emitting element EMU may include multiple light emitting elements LD connected in series or series/parallel between the anode connection electrode AE and the cathode connection electrode CE. In another embodiment, the sub-pixel SPX may include only a single light emitting element LD connected between the anode connection electrode AE and the cathode connection electrode CE.

The pixel circuit PXC of the sub-pixel SPX in accordance with the embodiment of the disclosure is not limited to the above-described example. In embodiments, the pixel circuit PXC may include seven transistors and one storage capacitor.

Hereinafter, a structure of electrodes of the display device 100 in accordance with an embodiment of the disclosure will be described.

Figure 5:
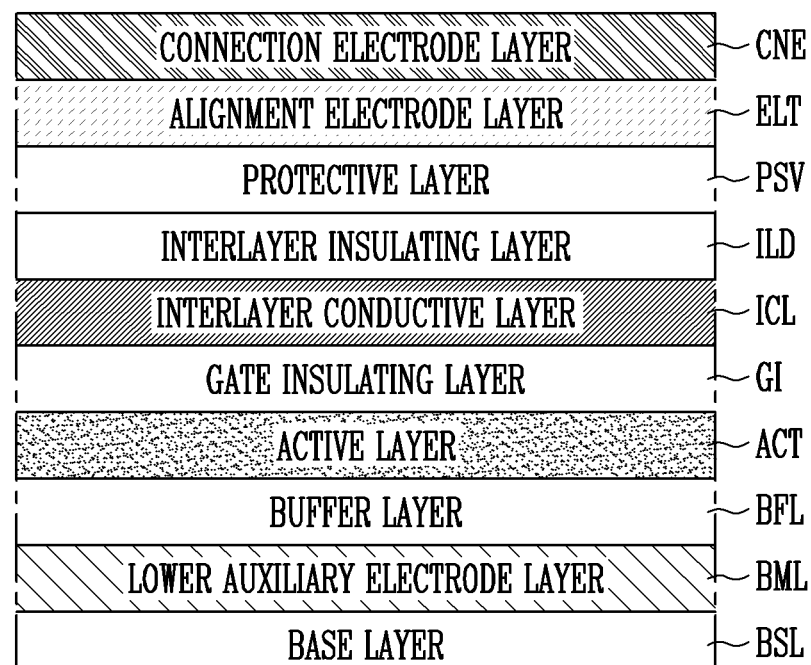
FIG. 5 is a schematic cross-sectional view illustrating a stacked structure included in the display device in accordance with an embodiment of the disclosure.

A stacked structure defined in the display device 100 will be described with reference to FIG. 5. FIG. 5 is a schematic cross-sectional view illustrating a stacked structure included in the display device in accordance with an embodiment of the disclosure.

Referring to FIG. 5, the stacked structure included in the display device 100 in accordance with the embodiment of the disclosure may have a form in which at least a portion of a structure is patterned, in which a base layer BSL, a lower auxiliary electrode layer BML, a buffer layer BFL, an active layer ACT, a gate insulating layer GI, an interlayer conductive layer ICL, an interlayer insulating layer ILD, a protective layer PSV, an alignment electrode layer ELT, and a connection electrode layer CNE are sequentially stacked.

The base layer BSL may form (or constitute) a base surface of the display device 100. The base layer BSL may include a rigid or flexible substrate or film. The substance of the base layer BSL or the material constituting the base layer BSL is not limited to a specific example, and the base layer BSL may include various materials.

The buffer layer BFL may be a layer for preventing an impurity from being diffused into the active layer ACT including a semiconductor or preventing moisture from infiltrating into the active layer ACT. In accordance with an embodiment, the buffer layer BFL may include at least one selected from the group consisting of silicon nitride ($SiN_x$), silicon oxide ($SiO_x$), silicon oxynitride ($SiO_xN_y$), and aluminum oxide ($AlO_x$). However, the disclosure is not necessarily limited to the above-described example.

Figure 7:
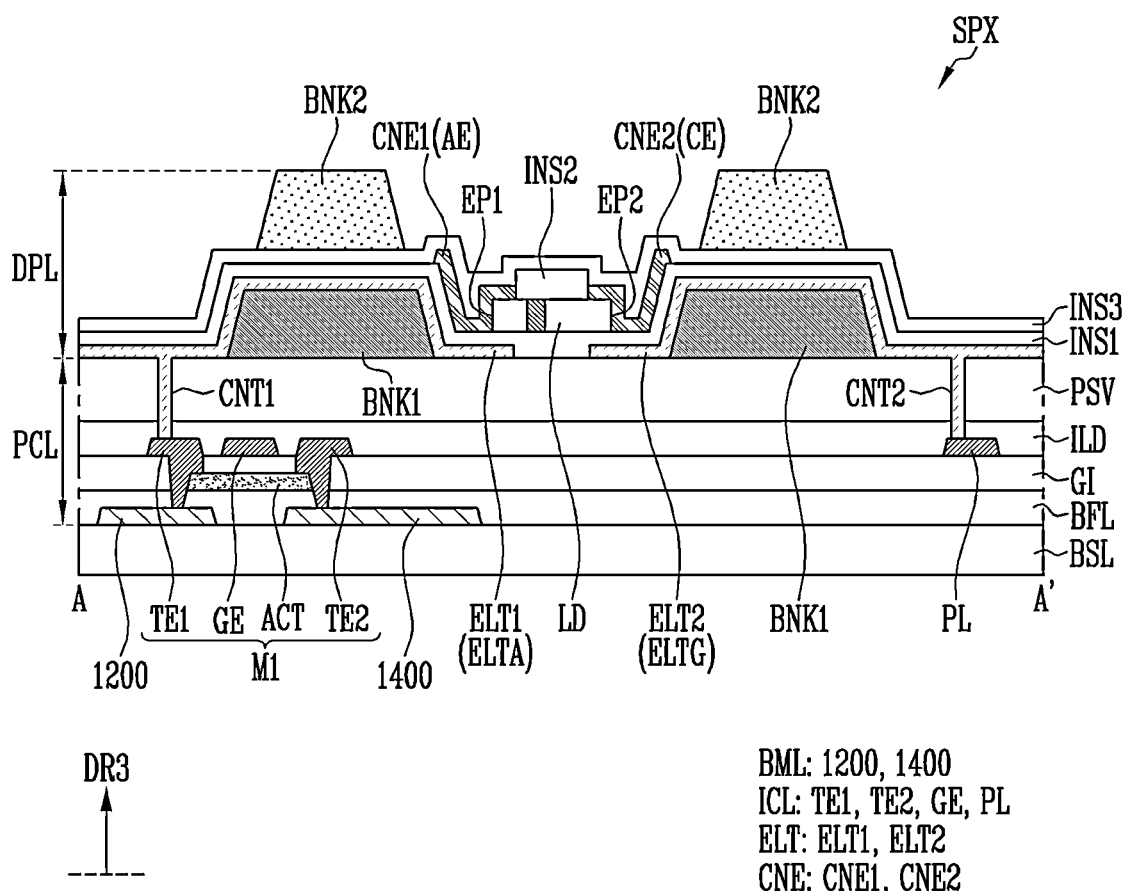
FIG. 7 is a schematic cross-sectional view taken along line A-A' shown in FIG. 6.

The active layer ACT may include a semiconductor. For example, the active layer ACT may include at least one selected from the group consisting of poly-silicon, Low Temperature Polycrystalline Silicon (LTPS), amorphous silicon, and an oxide semiconductor. In accordance with an embodiment, the active layer ACT may form a channel of the first transistor M1, the second transistor M2, and the third transistor M3, and an impurity may be doped into portions of the active layer ACT, which are in contact with first and second transistor electrodes ('TE1' and 'TE2,' which are shown in FIG. 7) of the interlayer conductive layer ICL.

The lower auxiliary electrode layer BML, the interlayer conductive layer ICL, the alignment electrode layer ELT, and the connection electrode layer CNE may be layers including a conductive material.

In accordance with an embodiment, each of the lower auxiliary electrode layer BML and the interlayer conductive layer ICL may include at least one conductive layer. In accordance with an embodiment, each of the lower auxiliary electrode layer BML and the interlayer conductive layer ICL may include at least one selected from the group consisting of gold (Au), silver (Ag), aluminum (Al), molybdenum (Mo), chromium (Cr), titanium (Ti), nickel (Ni), neodymium (Nd), copper (Cu), and platinum (Pt). However, the disclosure is not necessarily limited to the above-described example.

The gate insulating layer GI, the interlayer insulating layer ILD, and the protective layer PSV may be disposed between the active layer ACT, the interlayer conductive layer ICL, and the alignment electrode layer ELT to electrically separate the active layer ACT, the interlayer conductive layer ICL, and the alignment electrode layer ELT from each other. In accordance with an embodiment, the active layer ACT, the interlayer conductive layer ICL, and the alignment electrode layer ELT may be electrically connected to each other through a contact part CNT (see FIG. 6) or contact holes, formed in at least one of the gate insulating layer GI, the interlayer insulating layer ILD, and the protective layer PSV.

In accordance with an embodiment, the gate insulating layer GI, the interlayer insulating layer ILD, and the protective layer PSV may include at least one selected from the group consisting of silicon nitride ($SiN_x$), silicon oxide ($SiO_x$), silicon oxynitride ($SiO_xN_y$), and aluminum oxide ($AlO_x$). However, the disclosure is not necessarily limited to the above-described example. In embodiments, gate insulating layer GI, the interlayer insulating layer ILD, and/or the protective layer PSV may include an organic material.

In accordance with an embodiment, the alignment electrode layer ELT may include a conductive material. For example, the alignment electrode layer ELT may include at least one selected from the group consisting of molybdenum (Mo), a magnesium (Mg), silver (Ag), platinum (Pt), palladium (Pd), gold (Au), nickel (Ni), neodymium (Nd), iridium (Ir), chromium (Cr), titanium (Ti), copper (Cu), and aluminum (Al). However, the disclosure is not necessarily limited to the above-described example.

In accordance with an embodiment, the connection electrode layer CNE may include a conductive material. The connection electrode layer CNE may be electrically connected to the light emitting element LD. In embodiments, the connection electrode layer CNE may include a transparent conductive material. For example, the connection electrode layer CNE may include at least one selected from the group consisting of Indium Tin Oxide (ITO), Indium Zinc Oxide (IZO), and Indium Tin Zinc Oxide (ITZO). However, the disclosure is not necessarily limited to the above-described example. A first insulating layer INS1 (see FIG. 7) may be disposed between the alignment electrode layer ELT and the connection electrode layer CNE.

A structure of a sub-pixel SPX in accordance with an embodiment of the disclosure will be described. In the following drawings, the same layers as the above-described layers (e.g., patterning in the same process) may be expressed by using the same hatching. Schematic planar and cross-sectional structures of the sub-pixel SPX will be described with reference to FIGS. 6 to 8, and a structure of electrodes of the sub-pixel SPX including electrodes for forming a pixel circuit PXC will be described with reference to FIGS. 9 to 12. In FIGS. 6 to 12, descriptions of portions overlapping the above-described portions will be simplified or will not be repeated.

Figure 6:
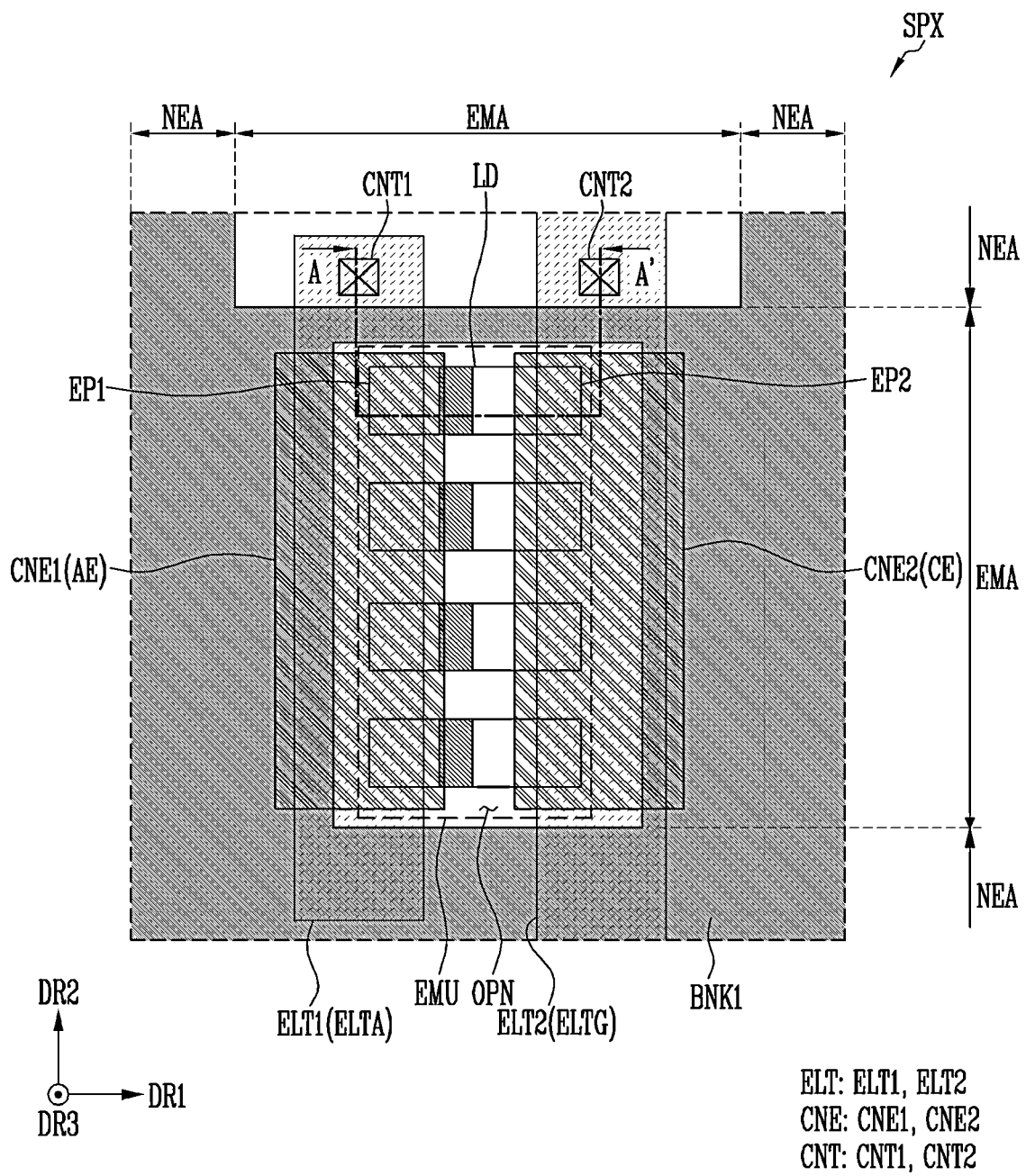
FIG. 6 is a schematic plan view illustrating a sub-pixel in accordance with an embodiment of the disclosure.
Figure 8:
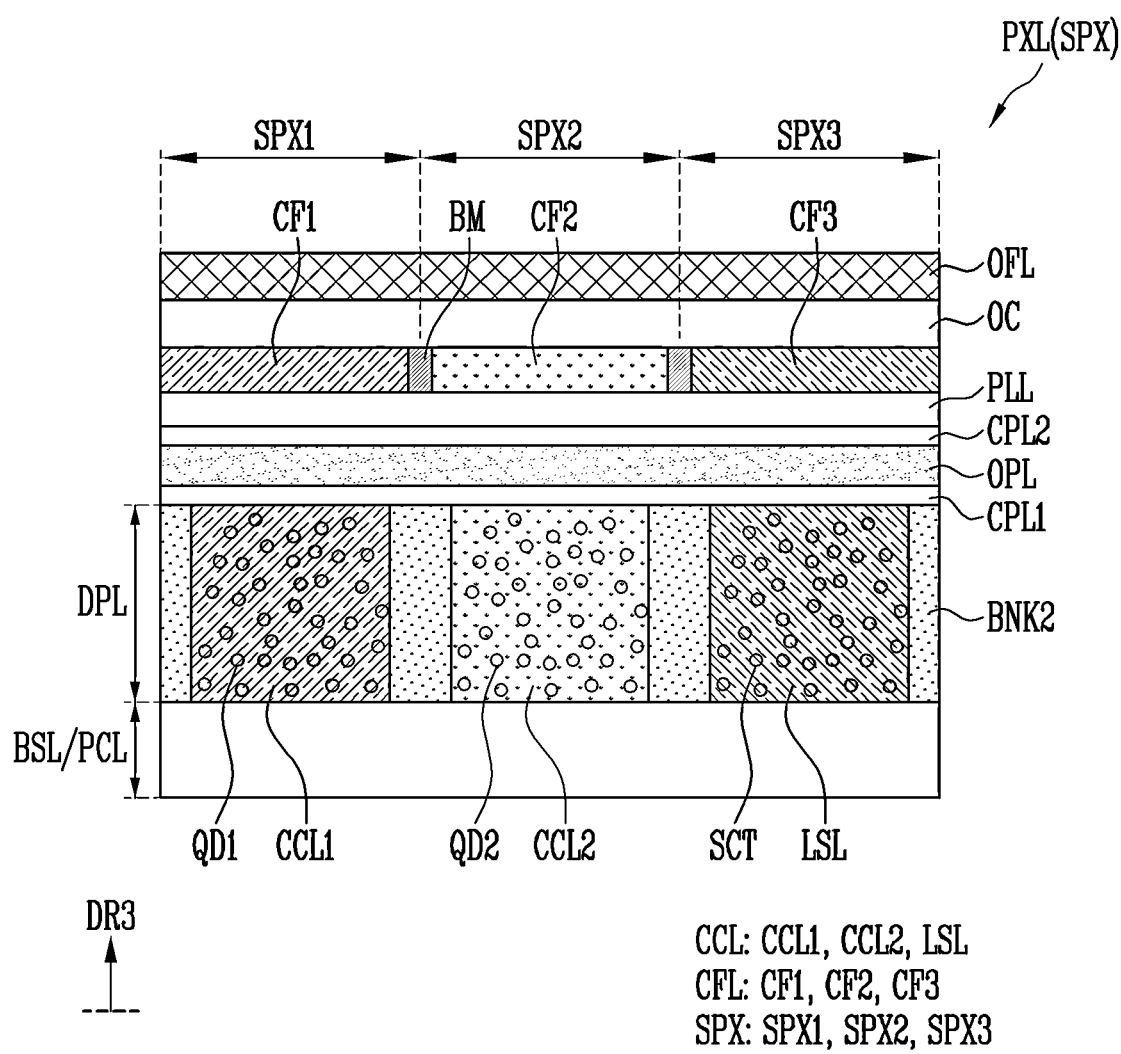
FIG. 8 is a schematic cross-sectional view illustrating a pixel in accordance with an embodiment of the disclosure.

FIGS. 6 to 8 are schematic views illustrating a sub-pixel in accordance with an embodiment of the disclosure. FIG. 6 is a schematic plan view illustrating a sub-pixel SPX in accordance with an embodiment of the disclosure. FIG. 7 is a schematic cross-sectional view taken along line A-A' shown in FIG. 6. FIG. 8 is a schematic cross-sectional view illustrating a pixel PXL in accordance with an embodiment of the disclosure.

The sub-pixel SPX may include an emission area EMA and a non-emission area NEA. The sub-pixel SPX may include a first bank BNK, an alignment electrode layer ELT, light emitting elements LD, and a connection electrode layer CNE.

The emission area EMA may overlap an opening OPN defined by the first bank BNK1 in a plan view. The light emitting elements LD may be disposed in the emission area EMA. The light emitting elements LD may not disposed in the non-emission area NEA.

The first bank BNK1 may form (or provide) the opening OPN. For example, the first bank BNK1 may have a shape protruding in a thickness direction of a base layer BSL (e.g., a third direction DR3), and have a form in which the first bank BNK1 surrounds an area. In embodiments, an ink INK (see FIG. 15) including the light emitting elements LD may be supplied to the opening OPN defined by the first bank BNK1, so that the light emitting elements LD are disposed in the opening OPN.

The alignment electrode layer ELT may include electrodes for aligning the light emitting elements LD. In embodiments, the alignment electrode layer ELT may include a first electrode ELT1 and a second electrode ELT2. In embodiments, the first electrode ELT1 may be a first alignment electrode ELTA, and the second electrode ELT2 may be a second alignment electrode ELTG.

The light emitting element LD may be disposed (or aligned) on the alignment electrode layer ELT. In embodiments, at least a portion of the light emitting element LD may be aligned between the first electrode ELT1 and the second electrode ELT2. The light emitting elements LD may form (or constitute) a unit light emitting element EMU.

In accordance with an embodiment, the first electrode ELT1 and the second electrode ELT2 may be spaced from each other in the first direction DR1 in the emission area EMA.

In accordance with an embodiment, the first electrode ELT1 as the first alignment electrode ELTA may be an electrode to which an AC signal may be supplied to align the light emitting elements LD. The first alignment electrode ELTA may be an electrode to which an anode signal may be supplied so that the light emitting elements LD emit light. The second electrode ELT2 as the second alignment electrode ELTG may be an electrode to which a ground signal may be supplied to align the light emitting elements LD.

The first electrode ELT1 (or the first alignment electrode ELTA) and the second electrode ELT2 (or the second alignment electrode ELTG) may be respectively supplied (or provided) with a first alignment signal and a second alignment signal in a process of aligning the light emitting elements LD. For example, the ink INK including the light emitting elements LD may be supplied (or provided) to the opening OPN defined by the first bank BNK1, the first alignment signal may be supplied to the first electrode ELT1, and the second alignment signal may be supplied to the second electrode ELT2. The first alignment signal and the second alignment signal may have different waveforms, different potentials, and/or different phases. For example, the first alignment signal may be the AC signal, and the second alignment signal may be the ground signal. However, the disclosure is not necessarily limited to the above-described example. An electric field may be formed between (or on) the first electrode ELT1 and the second electrode ELT2, so that the light emitting elements LD are aligned between the first electrode ELT1 and the second electrode ELT2, based on the electric field. For example, the light emitting elements LD may be moved (or rotated) by a force (a dielectrophoresis (DEP) force) according to the electric field to be aligned (or disposed) on the alignment electrode layer ELT.

The alignment electrode layer ELT may be electrically connected to another electrode pattern through a contact part CNT. The contact part CNT may include a first contact part CNT1 and a second contact part CNT2. For example, the first electrode ELT1 may be electrically connected to an interlayer conductive layer ICL (e.g., a first transistor electrode TE1 of a first transistor M1) (see FIG. 7) through the first contact part CNT1. The second electrode ELT2 may be electrically connected to the interlayer conductive layer ICL (e.g., a power line PL) (see FIG. 7) through the second contact part CNT2.

The light emitting element LD may emit light, based on an electrical signal provided thereto. For example, the light emitting element LD may emit light, based on a first electrical signal (e.g., an anode signal) provided from a first connection electrode CNE1 and a second electrical signal (e.g., a cathode signal) provided from a second connection electrode CNE2.

A first end portion EP1 of the light emitting element LD may be disposed adjacent to the first electrode ELT1, and a second end portion EP2 may be disposed adjacent to the second electrode ELT2.

The connection electrode layer CNE may be disposed on first end portions EP1 and second end portions EP2 of the light emitting elements LD. The first connection electrode CNE1 may be disposed on the first end portions EP1 of the light emitting elements LD and electrically connected to the first end portions EP1. The second connection electrode CNE2 may be disposed on the second end portions EP2 of the light emitting elements LD and electrically connected to the second end portions EP2.

In embodiments, the connection electrode layer CNE may include the first connection electrode CNE1 and the second connection electrode CNE2. The first connection electrode CNE1 may be an anode connection electrode AE, and the second connection electrode CNE2 may be a cathode connection electrode CE.

In FIG. 7, a cross-sectional structure of the sub-pixel SPX is schematically illustrated based on a pixel circuit layer PCL in which a pixel circuit PXC is formed and a display element layer DPL in which the light emitting elements LD are disposed.

Referring to FIG. 7, the sub-pixel SPX may be disposed on the base layer BSL. The sub-pixel SPX may include the pixel circuit layer PCL and the display element layer DPL. For convenience of descriptions, a first transistor M1 in the pixel circuit PXC is illustrated in FIG. 7.

The base layer BSL may provide an area in which the pixel circuit layer PCL and the display element layer DPL are disposed.

The pixel circuit layer PCL may be disposed on the base layer BSL. The pixel circuit layer PCL may include a lower auxiliary electrode layer BML, a buffer layer BFL, the first transistor M1, a gate insulating layer GI, an interlayer insulating layer ILD, and a protective layer PSV.

The lower auxiliary electrode layer BML may be disposed on the base layer BSL. The lower auxiliary electrode layer BML may include a first lower auxiliary electrode layer 1200 and a second lower auxiliary electrode layer 1400. The first lower auxiliary electrode layer 1200 may be electrically connected to a first transistor electrode TE1 of the first transistor M1, and the second lower auxiliary electrode layer 1400 may be electrically connected to a second transistor electrode TE2 of the first transistor M1.

The buffer layer BFL may be disposed on the base layer BSL. The buffer layer BFL may cover the lower auxiliary electrode layer BML.

The first transistor M1 may be a thin film transistor. In embodiments, the first transistor M1 may be a driving transistor. The first transistor M1 may be electrically connected to the light emitting element LD.

The first transistor M1 may include an active layer ACT, the first transistor electrode TE1, the second transistor electrode TE2, and a gate electrode GE.

The active layer ACT may include a first contact region in contact with the first transistor electrode TE1 and a second contact region in contact with the second transistor electrode TE2.

The gate electrode GE may be disposed on the gate insulating layer GI. A position of the gate electrode GE may correspond to a position of a channel region of the active layer ACT. For example, the gate electrode GE may be disposed on the channel region of the active layer ACT with the gate insulating layer GI interposed therebetween.

In embodiments, the gate electrode GE, the first transistor electrode TE1, and the second transistor electrode TE2 may be disposed in a same layer (e.g., an interlayer conductive layer ICL), and include a same material.

The gate insulating layer GI may be disposed on the buffer layer BFL. The gate insulating layer GI may cover the active layer ACT.

The interlayer insulating layer ILD may be disposed on the gate insulating layer GI. The interlayer insulating layer ILD may cover the gate electrode GE, the first transistor electrode TE1, and the second transistor electrode TE2.

The first transistor electrode TE1 may be electrically connected to the first electrode ELT1 through a first contact part CNT1 penetrating the interlayer insulating layer ILD and the protective layer PSV.

A power line PL may be disposed on the interlayer insulating layer ILD. In embodiments, the power line PL, the first transistor electrode TE1, and the second transistor electrode TE2 may be disposed in a same layer (e.g., the interlayer conductive layer ICL). The power line PL may be electrically connected to the second electrode ELT2 through a second contact part CNT2. The power line PL may be electrically connected to the second power line VSS (FIG. 4). The power line PL may supply a power or an alignment signal to the second electrode ELT2.

The protective layer PSV may be disposed on the interlayer insulating layer ILD. In embodiments, the protective layer PSV may be a via layer.

The display element layer DPL may be disposed on the pixel circuit layer PCL. The display element layer DPL may include a first insulating layer INS1, a first bank BNK1, an alignment electrode layer ELT, the light emitting element LD, a second insulating layer INS2, a connection electrode layer CNE, a third insulating layer INS3, and a second bank BNK2.

The first bank BNK1 may be disposed on the protective layer PSV. The first bank BNK1 may form a space (or opening) in which an ink including light emitting elements LD can be accommodated as described above. In embodiments, the first bank BNK1 may form a step difference such that the light emitting elements LD can be readily aligned in an emission area EMA. In embodiments, the alignment electrode layer ELT may be patterned on the first bank BNK1 and form a reflective wall.

The first bank BNK1 may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not limited to the above-described example.

The alignment electrode layer ELT may be disposed on the protective layer PSV and/or the first bank BNK1. The first electrode ELT1 may be electrically connected to the light emitting element LD. The second electrode ELT2 may be electrically connected to the light emitting element LD.

The first insulating layer INS1 may be disposed on the alignment electrode layer ELT. For example, the first insulating layer INS1 may cover the first electrode ELT1 and the second electrode ELT2.

The light emitting element LD may be disposed on the first insulating layer INS1 in an area surrounded by the first bank BNK1. In embodiments, the light emitting element LD may emit light, based on electrical signals (e.g., an anode signal and a cathode signal) provided from a first connection electrode CNE1 and a second connection electrode CNE2.

The second insulating layer INS2 may be disposed on the light emitting element LD. The second insulating layer INS2 may cover an active layer AL of the light emitting element LD. The second insulating layer INS2 may expose at least a portion of the light emitting element LD. For example, the second insulating layer INS2 may not cover a first end portion EP1 and a second end portion EP2 of the light emitting element LD. Accordingly, the first end portion EP1 and the second end portion EP2 of the light emitting element LD may be exposed, and be electrically connected respectively to the first connection electrode CNE1 and the second connection electrode CNE2.

In case that the second insulating layer INS2 is formed on the light emitting elements LD after the light emitting elements LD are completely aligned, the light emitting elements LD may be prevented from being separated from positions at which the light emitting elements LD are aligned.

The second insulating layer INS2 may have a single-layer or multi-layer structure. The second insulating layer INS2 may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited to the above-described example.

The first connection electrode CNE1 and the second connection electrode CNE2 may be disposed on the first insulating layer INS1. The first connection electrode CNE1 may be electrically connected to the first end portion EP1 of the light emitting element LD. The second connection electrode CNE2 may be electrically connected to the second end portion EP2 of the light emitting element LD.

The first connection electrode CNE1 may be electrically connected to the first electrode ELT1 through a contact hole penetrating the first insulating layer INS1, and the second connection electrode CNE2 may be electrically connected to the second electrode ELT2 through a contact hole penetrating the first insulating layer INS1.

In accordance with an embodiment, the first connection electrode CNE1 and the second connection electrode CNE2 may be patterned through a same process at the same time. However, the disclosure is not necessarily limited to the above-described example. After one of the first connection electrode CNE1 and the second connection electrode CNE2 is patterned, another one of the first connection electrode CNE1 and the second connection electrode CNE2 may be patterned.

The third insulating layer INS3 may be disposed on the first insulating layer INS1 and the connection electrode layer CNE. The third insulating layer INS3 may protect components of the display element layer DPL from external influence.

The third insulating layer INS3 may have a single-layer or multi-layer structure. The third insulating layer INS3 may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited to the above-described example.

The second bank BNK2 may be disposed on the first bank BNK1 (or the third insulating layer INS3). The second bank BNK2 may protrude in the thickness direction of the base layer BSL (e.g., the third direction DR3), thereby defining an area, and a space (or opening OPN) in which a color conversion layer CCL (see FIG. 8) is provided may be formed in the area.

The second bank BNK2 may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto.

In FIG. 8, a cross-sectional structure of sub-pixels SPX is schematically illustrated based on components disposed on the display element layer DPL.

Referring to FIG. 8, the second bank BNK2 may be disposed between first to third sub-pixels SPX1, SPX2, and SPX3 or a boundary of the first to third sub-pixels SPX1, SPX2, and SPX3, and define a space (or area) overlapping each of the first to third sub-pixels SPX1, SPX2, and SPX3. The space defined by the second bank BNK2 may be an area in which a color conversion layer CCL can be provided.

The color conversion layer CCL may be disposed above light emitting elements LD in the space surrounded by the second bank BNK2. The color conversion layer CCL may include a first color conversion layer CCL1 disposed in the first sub-pixel SPX1, a second color conversion layer CCL2 disposed in the second sub-pixel SPX2, and a light scattering layer LSL disposed in the third sub-pixel SPX3.

The color conversion layer CCL may be disposed above the light emitting element LD. The color conversion layer CCL may change a wavelength of light. In accordance with an embodiment, the first to third sub-pixels SPX1, SPX2, and SPX3 may include light emitting elements emitting light of the same color. For example, the first to third sub-pixels SPX1, SPX2, and SPX3 may include light emitting elements LD emitting light of a third color (or blue). The color conversion layer CCL including color conversion particles may be disposed on each of the first to third sub-pixels SPX1, SPX2, and SPX3, so that a full-color image can be displayed.

The first color conversion layer CCL1 may include first color conversion particles for converting light of the third color, which is emitted from the light emitting element LD, into light of a first color. For example, the first color conversion layer CCL1 may include multiple first quantum dots QD1 dispersed in a matrix material such as base resin.

In accordance with an embodiment, in case that the light emitting element LD is a blue light emitting element emitting light of blue, and the first sub-pixel SPX1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first sub-pixel SPX1 is a pixel of another color, the first color conversion layer CCL1 may include a first quantum dot QD1 corresponding to the color of the first sub-pixel SPX1.

The second color conversion layer CCL2 may include second color conversion particles for converting light of the third color, which is emitted from the light emitting element LD, into light of a second color. For example, the second color conversion layer CCL2 may include multiple second quantum dots QD2 dispersed in a matrix material such as base resin.

In accordance with an embodiment, in case that the light emitting element LD is a blue light emitting element emitting light of blue, and the second sub-pixel SPX2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second sub-pixel SPX2 is a pixel of another color, the second color conversion layer CCL2 may include a second quantum dot QD2 corresponding to the color of the second sub-pixel SPX2.

In accordance with an embodiment, light of blue having a relatively short wavelength in a visible light band may be incident into the first quantum dot QD1 and the second quantum dot QD2, so that absorption coefficients of the first quantum dot QD1 and the second quantum dot QD2 can be increased. Accordingly, the efficiency of light finally emitted from the first sub-pixel SPX1 and the second sub-pixel SPX2 may be improved, and excellent color reproduction may be ensured. The unit light emitting element EMU of each of the first to third sub-pixels SPX1, SPX2, and SPX3 may include light emitting elements of the same color (e.g., blue light emitting elements), so that the manufacturing efficiency of the display device 100 can be improved.

The light scattering layer LSL may be provided to efficiently use light of the third color (or blue) emitted from the light emitting element LD. For example, in case that the light emitting element LD is a blue light emitting element emitting light of blue, and the third sub-pixel SPX3 is a blue pixel, the light scattering layer LSL may include at least one kind of light scattering particle SCT to efficiently use light emitted from the light emitting element LD. For example, the light scattering particle SCT of the light scattering layer LSL may include at least one selected from the group consisting of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scattering particle SCT may be not disposed only in the third sub-pixel SPX3, and may be selectively included in the first color conversion layer CCL1 or the second color conversion layer CCL2. In embodiments, the light scattering particle SCT may be omitted such that the light scattering layer LSL including transparent polymer is provided.

A first capping layer CPL1 may be disposed on the color conversion layer CCL. The first capping layer CPL1 may be provided throughout the first to third sub-pixels SPX1, SPX2, and SPX3. The first capping layer CPL1 may cover the color conversion layer CCL. The first capping layer CPL1 may prevent the color conversion layer CCL from being damaged or contaminated due to infiltration by an impurity such as moisture or air from the outside.

The first capping layer CPL1 may be an inorganic layer, and may include at least one selected from the group consisting of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and silicon oxynitride ($SiO_xN_y$).

An optical layer OPL may be disposed on the first capping layer CPL1. The optical layer OPL may improve light emission efficiency by recycling light provided from the color conversion layer CCL through total reflection. The optical layer OPL may have a refractive index relatively lower than a refractive index of the color conversion layer CCL. For example, the refractive index of the color conversion layer may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be provided throughout the first to third sub-pixels SPX1, SPX2, and SPX3. The second capping layer CPL2 may cover the optical layer OPL. The second capping layer CPL2 may prevent the optical layer OPL from being damaged or contaminated due to infiltration by an impurity such as moisture or air from the outside.

The second capping layer CPL2 may be an inorganic layer, and may include at least one selected from the group consisting of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and silicon oxynitride ($SiO_xN_y$).

A planarization layer PLL may be disposed on the second capping layer CPL2. The planarization layer PLL may be provided throughout the first to third sub-pixels SPX1, SPX2, and SPX3.

The planarization layer PLL may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third sub-pixels SPX1, SPX2, and SPX3 may be disposed, so that a full-color image can be displayed.

The color filter layer CFL may include a first color filter CF1 disposed in the first sub-pixel SPX1 to allow light emitted from the first sub-pixel SPX1 to be selectively transmitted therethrough, a second color filter CF2 disposed in the second sub-pixel SPX2 to allow light emitted from the second sub-pixel SPX2 to be selectively transmitted therethrough, and a third color filter CF3 disposed in the third sub-pixel SPX3 to allow light emitted from the third sub-pixel SPX3 to be selectively transmitted therethrough.

In accordance with an embodiment, the first color filter CF1, the second color filter CF2, and the third color filter CF3 may be respectively a red color filter, a green color filter, and a blue color filter, but the disclosure is not necessarily limited thereto. Hereinafter, in case that an arbitrary color filter among the first color filter CF1, the second color filter CF2, and the third color filter CF3 is designated or in case that two or more kinds of color filters are inclusively designated, the corresponding color filter or the corresponding color filters are referred to as a "color filter CF" or "color filters CF."

The first color filter CF1 may overlap the first color conversion layer CCL1 in the thickness of the base layer BSL (e.g., the third direction DR3). The first color filter CF1 may include a color filter material for allowing light of a first color (or red) to be selectively transmitted therethrough. For example, in case that the first sub-pixel SPX1 is a red pixel, the first color filter CF1 may include a red color filter material.

The second color filter CF2 may overlap the second color conversion layer CCL2 in the thickness of the base layer BSL (e.g., the third direction DR3). The second color filter CF2 may include a color filter material for allowing light of a second color (or green) to be selectively transmitted therethrough. For example, in case that the second sub-pixel SPX2 is a green pixel, the second color filter CF2 may include a green color filter material.

The third color filter CF3 may overlap the light scattering layer LSL in the thickness of the base layer BSL (e.g., the third direction DR3). The third color filter CF3 may include a color filter material for allowing light of a third color (or blue) to be selectively transmitted therethrough. For example, in case that the third sub-pixel SPX3 is a blue pixel, the third color filter CF3 may include a blue color filter material.

In embodiments, a light blocking layer BM may be disposed between the first to third color filters CF1, CF2, and CF3. As described above, in case that the light blocking layer BM is formed between the first to third color filters CF1, CF2, and CF3, a color mixture defect viewed from the front or side of the display device 100 may be prevented. The material of the light blocking layer BM is not particularly limited, and the light blocking layer BM may include various light blocking materials. For example, the light blocking layer BM may include a black matrix, or be implemented by stacking the first to third color filters CF1, CF2, and CF3.

An overcoat layer OC may be disposed on the color filter layer CFL. The overcoat layer OC may be provided throughout the first to third sub-pixels SPX1, SPX2, and SPX3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as an acrylic resin, epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

An outer film layer OFL may be disposed on the overcoat layer OC. The outer film layer OFL may be disposed on an outer portion of the display device 100, to reduce external influence. The outer film layer OFL may be provided throughout the first to third sub-pixels SPX1, SPX2, and SPX3. In embodiments, the outer film layer OFL may include at least one of a polyethylenephthalate (PET) film, a low reflective film, a polarizing film, and a transmittance controllable film, but the disclosure is not necessarily limited thereto. In embodiments, the pixel PXL may include an upper substrate instead of the outer film layer OFL.

A structure of electrodes of a sub-pixel SPX including electrodes for forming a pixel circuit PXC will be described in more detail. In FIGS. 9 to 12, descriptions of portions overlapping the above-described description will be simplified or will not be repeated.

Figure 9:
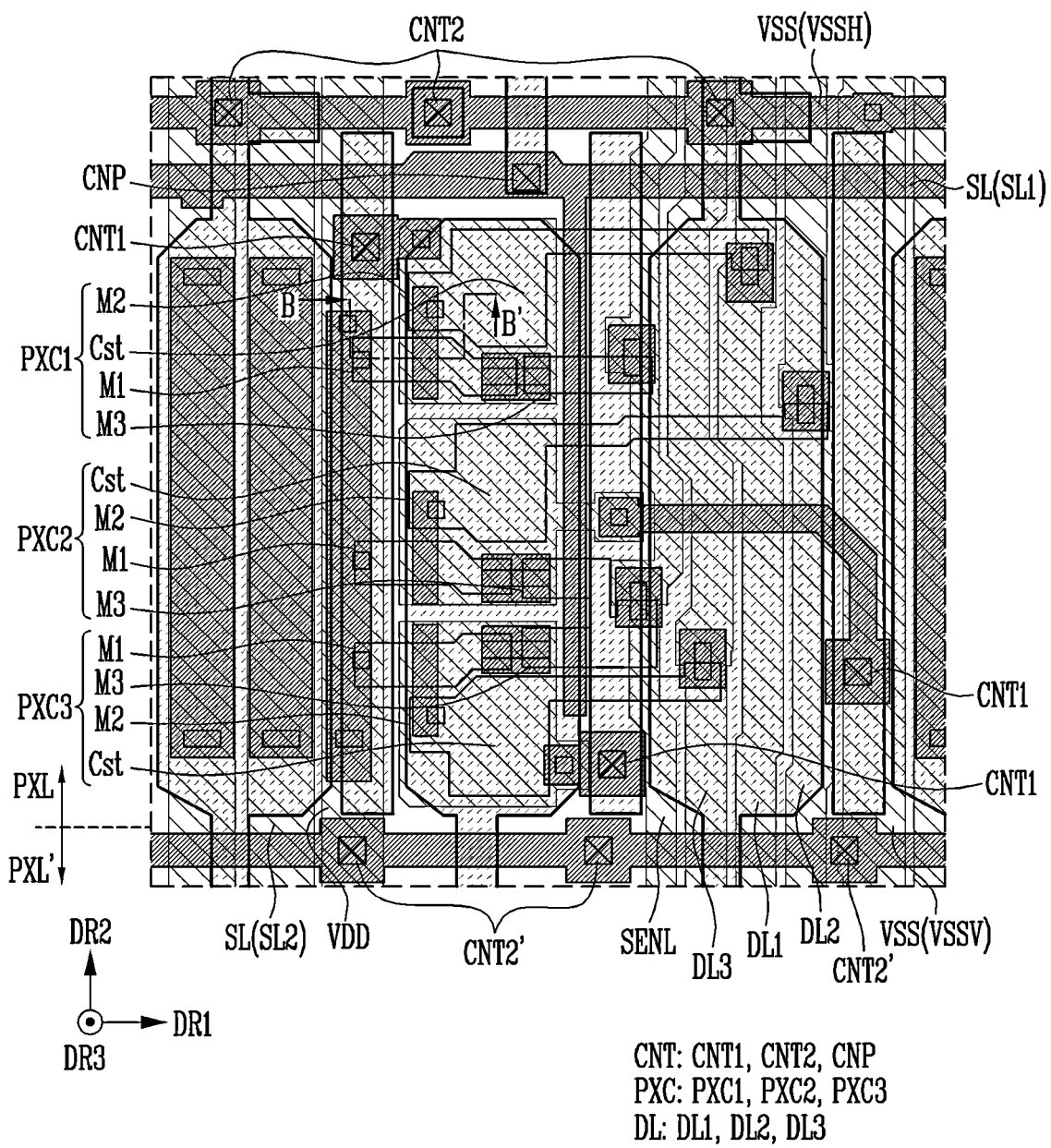
FIGS. 9 and 10 are schematic layout views illustrating electrodes included in a pixel in accordance with an embodiment of the disclosure.
Figure 10:
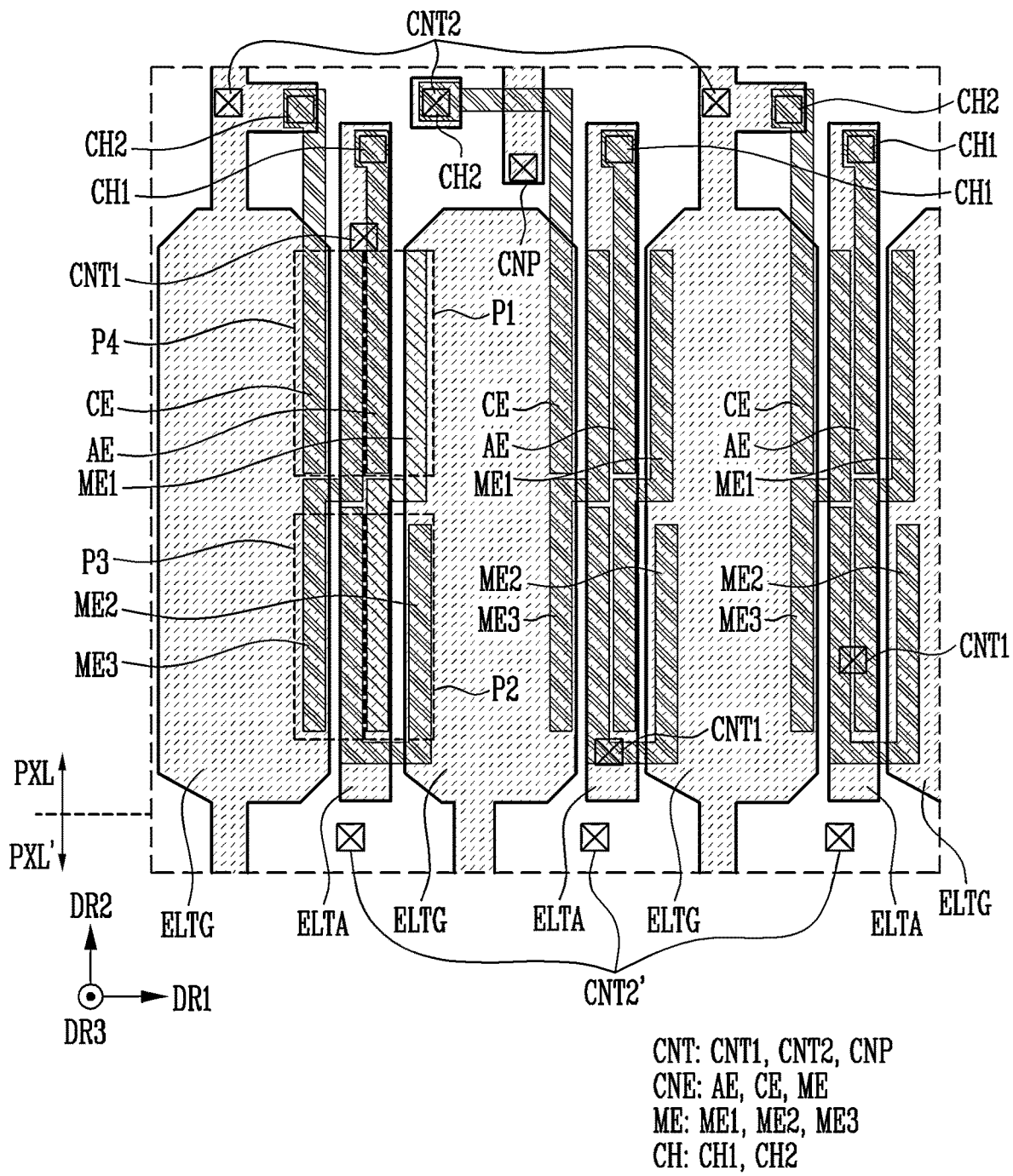

FIGS. 9 and 10 are schematic layout views illustrating electrodes included in a pixel in accordance with an embodiment of the disclosure. In FIGS. 9 and 10, electrodes of a pixel PXL (or sub-pixel SPX) are illustrated. In FIGS. 9 and 10, different layers disposed in the same area are illustrated.

In FIG. 9, the lower auxiliary electrode layer BML, the active layer ACT, and the interlayer conductive layer ICL, which are described above with reference to FIG. 5, are illustrated. In FIG. 10, the alignment electrode layer ELT and the connection electrode layer CNE, which are described above with reference to FIG. 5, are illustrated. A range in which the alignment electrode layer ELT is disposed is also schematically illustrated in FIG. 9 to allow an area shown in FIG. 9 and an area shown in FIG. 10 to correspond to each other. In FIG. 9, only a patterning range of the active layer ACT without hatching is expressed by a solid line such that the drawing can be clearly illustrated in FIG. 9.

In FIGS. 9 and 10, a contact part CNT is illustrated to have a form in which X is displayed in a quadrangular shape. In FIG. 9, contact holes for electrically connecting different patterns (e.g., the lower auxiliary electrode layer BML, the active layer ACT, and the interlayer conductive layer ICL) to each other are illustrated in a quadrangular shape. In FIG. 10, contact members CH for electrically connecting the alignment electrode layer ELT and the connection electrode layer CNE to each other are illustrated in a quadrangular shape.

In accordance with an embodiment, pixel circuits PXC and lines connected to the pixel circuits PXC may be disposed (or patterned) in a pixel PXL.

The pixel circuit PXC may include a first pixel circuit PXC1, a second pixel circuit PXC2, and a third pixel circuit PXC3. Each of the first pixel circuit PXC1, the second pixel circuit PXC2, and the third pixel circuit PXC3 may include a first transistor M1, a second transistor M2, a third transistor M3, and a storage capacitor Cst.

The pixel circuits PXC may be disposed adjacent to each other in the second direction DR2. For example, the first pixel circuit PXC1, the second pixel circuit PXC2, and the third pixel circuit PXC3 may be disposed adjacent to each other in the second direction DR2.

A first scan line SL1 among scan lines SL may extend in the first direction DR1. A second scan line SL2 among the scan lines SL may extend in the second direction DR2. The first scan line SL1 and the second scan line SL2 may be electrically connected to each other through a contact area CP (not shown in FIG. 9).

Data lines DL may extend in the second direction DR2. The data lines DL may be spaced from each other in the first direction DR1. The data lines DL may include a first data line DL1, a second data line DL2, and a third data line DL3.

The first data line DL1 may be a data line DL for the first pixel circuit PXC1 of the first sub-pixel SPX1. The second data line DL2 may be a data line DL for the second pixel circuit PXC2 of the second sub-pixel SPX2. The third data line DL3 may be a data line DL for the third pixel circuit PXC3 of the third sub-pixel SPX3.

A sensing line SENL may extend in the second direction DR2. The sensing line SENL may be electrically connected to third transistors M3 of the first to third pixel circuits PXC1, PXC2, and PXC3.

A first power line VDD may extend in the second direction DR2. A second power line VSS may include a (2_H)th power line VSSH extending in the first direction DR1 and a (2_V)th power line VSSV extending in the second direction DR2. The (2_H)th power line VSSH and the (2_V)th power line VSSV may be electrically connected to each other through a contact hole.

The second power line VSS (e.g., the (2_H)th power line VSSH) may be electrically connected to the alignment electrode layer ELT through a second contact part CNT2. A second power line VSS' (e.g., a (2_H)th power line VSSH') of another adjacent pixel PXL' may be electrically connected to the alignment electrode layer ELT through a second contact part CNT2'.

Contact parts CNT may electrically connect the interlayer conductive layer ICL and the alignment electrode layer ELT to each other. In embodiments, the contact parts CNT may include a first contact part CNT1 and the second contact part CNT2. The contact parts CNT may also include a scan contact part CNP.

The first contact part CNT1 may be a member for electrically connecting a first alignment electrode ELTA of the alignment electrode layer ELT to other electrode pattern (e.g., a conductive pattern electrically connected to the first power line VDD). The second contact part CNT2 may be a member for electrically connecting a second alignment electrode ELTG of the alignment electrode layer ELT to other electrode pattern (e.g., the second power line VSS).

The scan contact part CNP may electrically connect the scan line SL (e.g., the first scan line SL1) and the alignment electrode layer ELT to each other. For example, the scan contact part CNP may be electrically connected to an extension electrode pattern BELT (FIG. 11) extending from an alignment electrode layer ELT of another pixel PXL adjacent to the scan line SL. This will be described in detail later with reference to FIGS. 11 and 12.

The alignment electrode layer ELT may include the first alignment electrode ELTA and the second alignment electrode ELTG. The first alignment electrode ELTA and the second alignment electrode ELTG may extend in the second direction DR2. The first alignment electrode ELTA and the second alignment electrode ELTG may be spaced from each other in the first direction DR1. The first alignment electrode ELTA and the second alignment electrode ELTG may be spaced from each other, to form an area in which light emitting elements LD can be disposed. The first alignment electrode ELTA and the second alignment electrode ELTG may be alternately arranged in the first direction DR1.

The connection electrode layer CNE may include an anode connection electrode AE, a cathode connection electrode CE, and an intermediate connection electrode ME. In embodiments, the intermediate connection electrode ME may include a first intermediate connection electrode ME1, a second intermediate connection electrode ME2, and a third intermediate connection electrode ME3.

The connection electrode layer CNE may be electrically connected to the alignment electrode layer ELT through a contact member CH. For example, the anode connection electrode AE may be electrically connected to the first alignment electrode ELTA through a first contact member CH1 among contact members CH. The cathode connection electrode CE may be electrically connected to the second alignment electrode ELTG through a second contact member CH2 among the contact members CH. The intermediate connection electrode ME and a light emitting element LD may form an electrical path between the anode connection electrode AE and the cathode connection electrode CE. For example, in a first area P1, light emitting elements LD may be electrically connected between the anode connection electrode AE and the first intermediate connection electrode ME1. In a second area P2, light emitting elements LD may be electrically connected between the first intermediate connection electrode ME1 and the second intermediate connection electrode ME2. In a third area P3, light emitting elements LD may be electrically connected between the second intermediate connection electrode ME2 and the third intermediate connection electrode ME3. In a fourth area P4, light emitting elements LD may be electrically connected between the third intermediate connection electrode ME3 and the cathode connection electrode CE. The structure in which the light emitting elements are arranged is not necessarily limited to the above-described example. For example, the number of intermediate connection electrodes ME may be variously changed.

Figure 11:
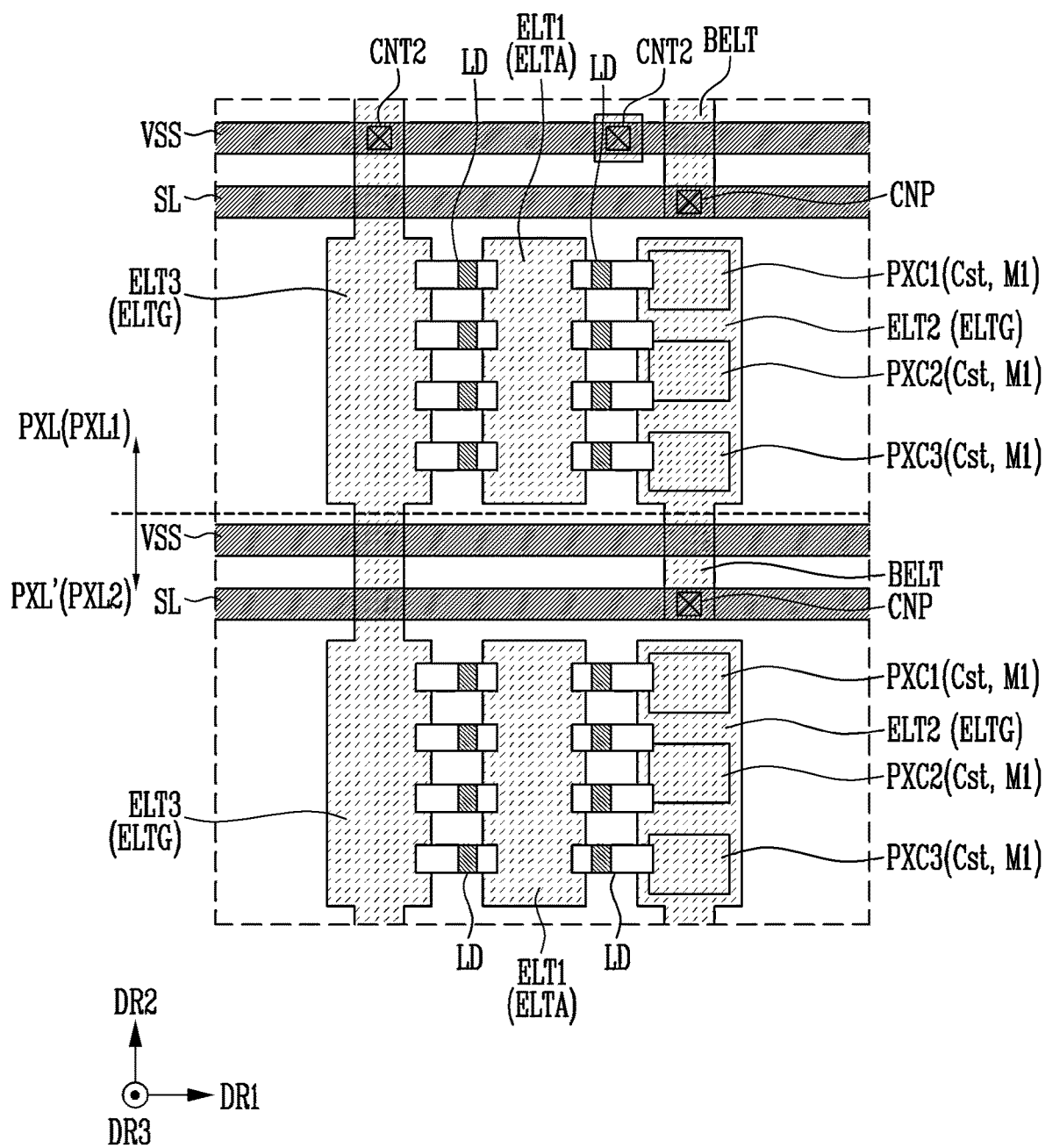
FIG. 11 is a schematic plan view illustrating pixels adjacent to each other in accordance with an embodiment of the disclosure.
Figure 12:
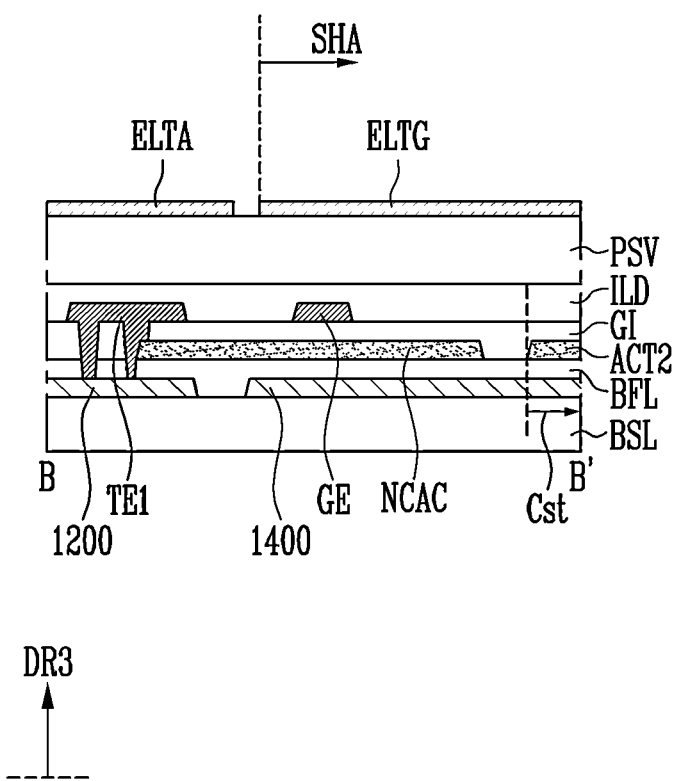
FIG. 12 is a schematic cross-sectional view taken along line B-B' shown in FIG. 9.

An electrical connection structure between a pixel PXL and an adjacent pixel PXL' will be described with reference to FIGS. 11 and 12. In FIGS. 11 and 12, descriptions of portions overlapping the above-described description will be simplified or will not be repeated.

FIG. 11 is a schematic plan view illustrating pixels adjacent to each other in accordance with an embodiment of the disclosure. FIG. 12 is a schematic cross-sectional view taken along line B-B' shown in FIG. 9.

Referring to FIGS. 11 and 12, at least two pixels PXL and PXL' may be disposed adjacent to each other. For convenience of description, an embodiment in which the at least two pixels PXL and PXL' are adjacent to each other in the second direction DR2 is described. For convenience of description, a pixel PXL is designated as a first pixel PXL1, and a pixel PXL' adjacent to the pixel PXL is designated as a second pixel PXL2. In FIG. 11, one of sub-pixels SPX of the pixel PXL is illustrated, and one of sub-pixels SPX of the adjacent pixel PXL' is illustrated. However, the disclosure is not necessarily limited to the above-described example.

The first pixel PXL1 and the second pixel PXL2 may have structures corresponding to each other. A scan line SL and a second power line VSS may be disposed on a side of each of the first pixel PXL1 and the second pixel PXL2. In each of the first pixel PXL1 and the second pixel PXL2, with respect to a first electrode ELT1 as a first alignment electrode ELTA, a second electrode ELT2 as a second alignment electrode ELTG may be disposed on a side, and a third electrode ELT3 as a second alignment electrode ELTG may be disposed on another side. The third electrode ELT3 in FIG. 11 may correspond to the second electrode ELT2 in FIG. 7. Also, in each of the first pixel PXL1 and the second pixel PXL2, light emitting elements LD may be aligned between the first electrode ELT1 and the second electrode ELT2, and light emitting elements LD may be aligned between the first electrode ELT1 and the third electrode ELT3.

In embodiments, the scan line SL of the first pixel PXL1 may be designated as a first pixel scan line. The scan line SL of the second pixel PXL2 may be designated as a second pixel scan line.

In accordance with an embodiment, the second power line VSS may supply a second power to the third electrode ELT3. For example, the second power line VSS may provide an electrical signal to the third electrode ELT3 through a second contact part CNT2. In embodiments, the second power line VSS may not supply the second power to the second electrode ELT2. For example, the second power line VSS may be electrically connected to a portion of the alignment electrode layer ELT adjacent to the second electrode ELT2 through the second contact part CNT2. However, the portion of the alignment electrode layer ELT adjacent to the second electrode ELT2, which is electrically connected to the second power line VSS, may be separated from an extension electrode pattern BELT. Accordingly, the second power may not be supplied to the extension electrode pattern BELT, and the electrical signal supplied by the second power line VSS may not be provided to the second electrode ELT2.

First to third pixel circuits PXC1, PXC2, and PXC3 may be sequentially arranged in a direction (e.g., the second direction DR2) in which the first and second alignment electrodes ELTA and ELTG extend. For example, storage capacitors Cst of the first to third pixel circuits PXC1, PXC2, and PXC3 may be sequentially arranged in the second direction DR2.

The pixel circuits PXC may overlap the alignment electrode layer ELT in a plan view. The pixel circuits PXC may be covered by the alignment electrode layer ELT in a plan view. For example, the first to third pixel circuits PXC1, PXC2, and PXC3 may overlap the second electrode ELT2 as the second alignment electrode ELTG in a plan view.

A portion of the alignment electrode layer ELT overlapping the pixel circuits PXC may be electrically connected to the extension electrode pattern BELT. For example, the second electrode ELT2 of the first pixel PXL1 may be integrally formed with the extension electrode pattern BELT, and electrically connected to the extension electrode pattern BELT.

The extension electrode pattern BELT may be electrically connected to the scan line SL of the second pixel PXL2 adjacent to the first pixel PXL1 through a scan contact part CNP. For example, the extension electrode pattern BELT of the first pixel PXL1 may extend from the first pixel PXL1 to a partial area of the second pixel PXL2. The extension electrode pattern BELT may overlap the scan line SL in a plan view, and be supplied with an electrical signal (e.g., a scan signal of the second pixel PXL2) from the scan line SL.

The extension electrode pattern BELT may extend to be in parallel to a direction (e.g., the second direction DR2) in which the pixel circuits PXC are sequentially arranged. The extension electrode patterns BELT may extend to be parallel to a direction in which the alignment electrodes ELTA and ELTG extend.

A portion of the alignment electrode layer ELT may form a shielding area SHA. In embodiments, when the light emitting elements LD emit light, an electrical signal may be supplied to a portion of the alignment electrode layer ELT overlapping the pixel circuits PXC (e.g., gate electrodes GE of first transistors M1 or storage capacitors Cst). In embodiments, the second alignment electrode ELTG (e.g., the second electrode ELT2) of the first pixel PXL1 may be supplied with the scan signal of the adjacent second pixel PXL2 from the extension electrode pattern BELT, and form a shielding area SHA covering lower electrode patterns.

In accordance with an embodiment, a gate electrode GE of a first transistor M1 of each of the pixel circuits PXC may overlap the shielding area SHA in a plan view.

The gate electrode GE of the first transistor M1 of each of the pixel circuits PXC may be entirely covered by the second alignment electrode ELTG (e.g., the second electrode ELT2) in the shielding area SHA.

In accordance with an embodiment, the gate electrode GE of the first transistor M1 of each of the pixel circuits PXC may overlap the shielding area SHA in a plan view.

A non-covering active layer NCAC of the first transistor M1 of each of the pixel circuits PXC may be entirely covered by the second alignment electrode ELTG (e.g., the second electrode ELT2) in the shielding area SHA. The non-covering active layer NCAC may be a portion of an active layer ACT, and may be an area not overlapping the gate electrode GE.

In accordance with an embodiment, areas in the storage capacitors Cst in the pixel circuits PXC may overlap the shielding area SHA in a plan view.

In accordance with an embodiment, the storage capacitor Cst may include a first capacitor electrode including a second active layer ACT2, which is a portion of the active layer ACT and a second capacitor electrode including a second lower auxiliary electrode layer 1400, which is a portion of a lower auxiliary electrode layer BML. The second alignment electrode ELTG may entirely cover the first capacitor electrode and the second capacitor electrode in the shielding area SHA.

In accordance with an embodiment, the scan signal of the second pixel PXL2 disposed adjacent to the first pixel PXL1 (e.g., disposed in another row or column) may be supplied to the second alignment electrode ELTG of the first pixel PXL1. The second alignment electrode ELTG of the first pixel PXL1, to which the scan signal of the adjacent second pixel PXL2 is supplied, may cover the gate electrode GE and the non-covering active layer NCAC of the first transistor M1. Because of this, formation of a coupling capacitance between the gate electrode GE of the first transistor M1 and the second alignment electrode ELTG may be prevented. In case that a coupling capacitance is formed, an electrical signal supplied to the pixel PXL may be distorted, and a horizontal crosstalk may be caused due to a signal delay. However, in accordance with an embodiment, the scan signal supplied to a portion of the alignment electrode layer ELT to prevent the coupling capacitance may be a signal corresponding to the adjacent pixel PXL' (PXL2), and thus a formation of the coupling capacitance may be prevented. Accordingly, the reliability of the electrical signal may be improved, and the horizontal crosstalk may be prevented.

Hereinafter, a manufacturing method of the display device 100 in accordance with an embodiment of the disclosure will be described with reference to FIGS. 13 to 19. In FIGS. 13 to 19, descriptions of portions overlapping the above-described description will be simplified or will not be repeated.

FIGS. 13 to 16 are schematic plan views illustrating a manufacturing method of the display device in accordance with an embodiment of the disclosure. FIGS. 13 to 16 are illustrated based on the planar structure described above with reference to FIG. 11.

Figure 17:
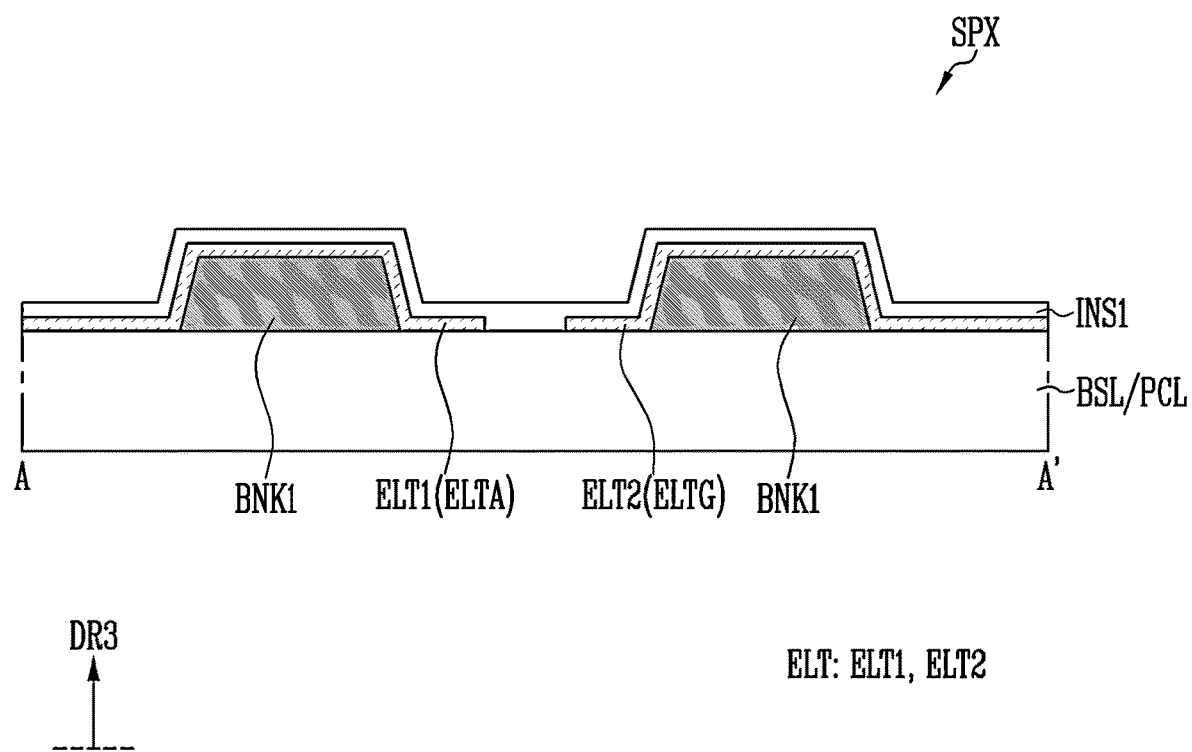
FIGS. 17 to 19 are schematic cross-sectional views illustrating a manufacturing method for the display device in accordance with an embodiment of the disclosure.
Figure 18:
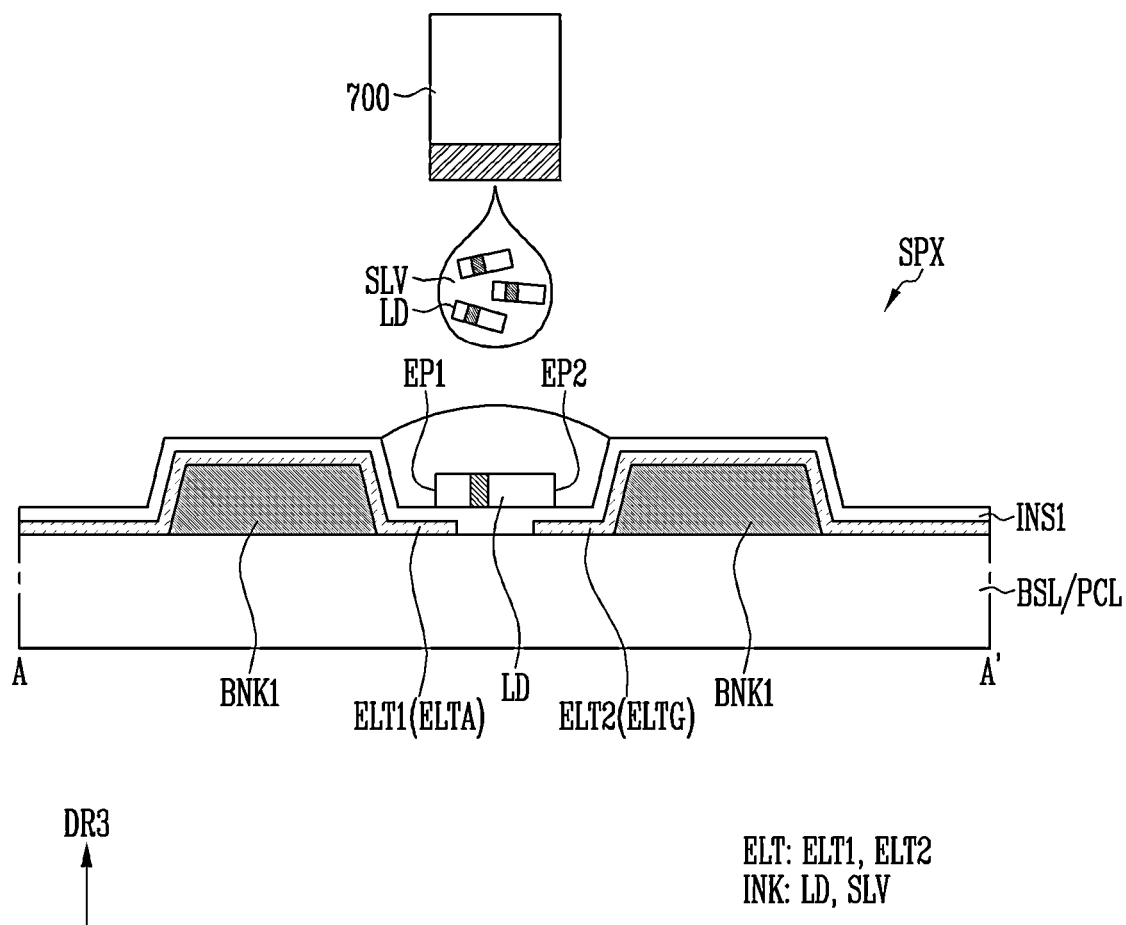
Figure 19:
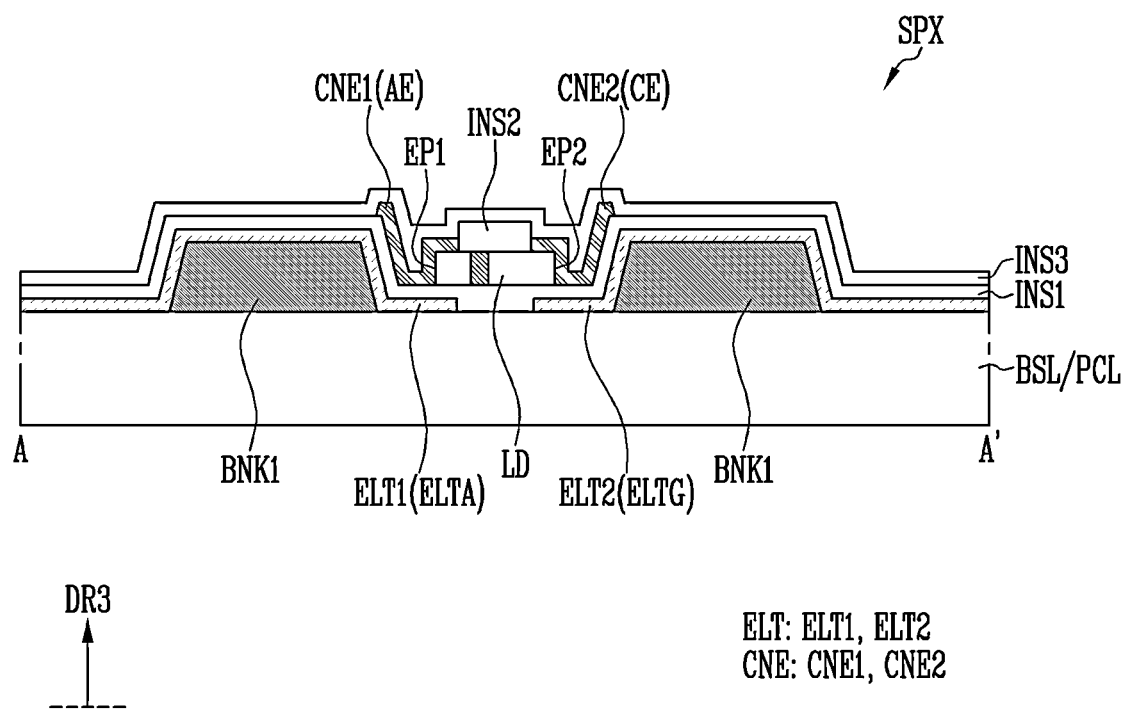

FIGS. 17 to 19 are schematic cross-sectional views illustrating a manufacturing method of the display device in accordance with an embodiment of the disclosure. FIGS. 17 to 19 are illustrated based on the planar structure described above with reference to FIG. 7. For convenience of description, a pixel circuit layer PCL is briefly illustrated in FIGS. 17 to 19.

Figure 13:
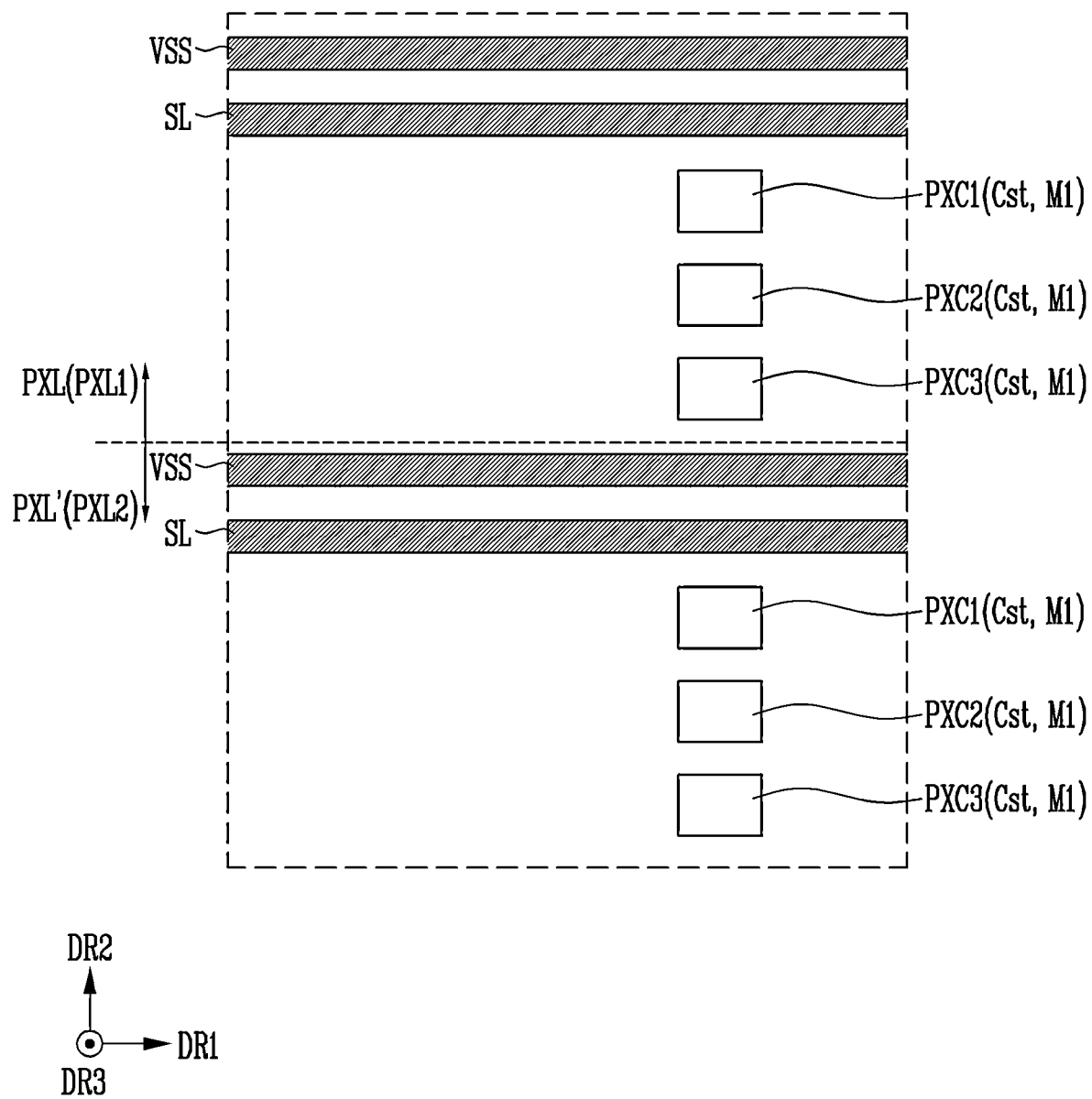
FIGS. 13 to 16 are schematic plan views illustrating a manufacturing method for the display device in accordance with an embodiment of the disclosure.

Referring to FIGS. 13 and 17, a pixel circuit layer PCL may be formed on a base layer BSL. For example, first and second power lines VDD and VSS and a scan line SL may be formed on the base layer BSL. For convenience of description, illustration of the first power line VDD is omitted in these drawings.

Individual components of the pixel circuit layer PCL disposed on the base layer BSL may be formed by patterning a conductive layer (or metal layer), an inorganic material, an organic material, or the like through an ordinary process using a mask.

The second power line VSS may be patterned in the first direction DR1 to correspond to each of a first pixel PXL1 and a second pixel PXL2. The scan line SL may be patterned in the first direction DR1 to correspond to each of the first pixel PXL1 and the second pixel PXL.

A pixel circuit PXC may be formed. For example, first to third pixel circuits PXC1, PXC2, and PXC3 may be formed in each of the first pixel PXL1 and the second pixel PXL2.

Figure 14:
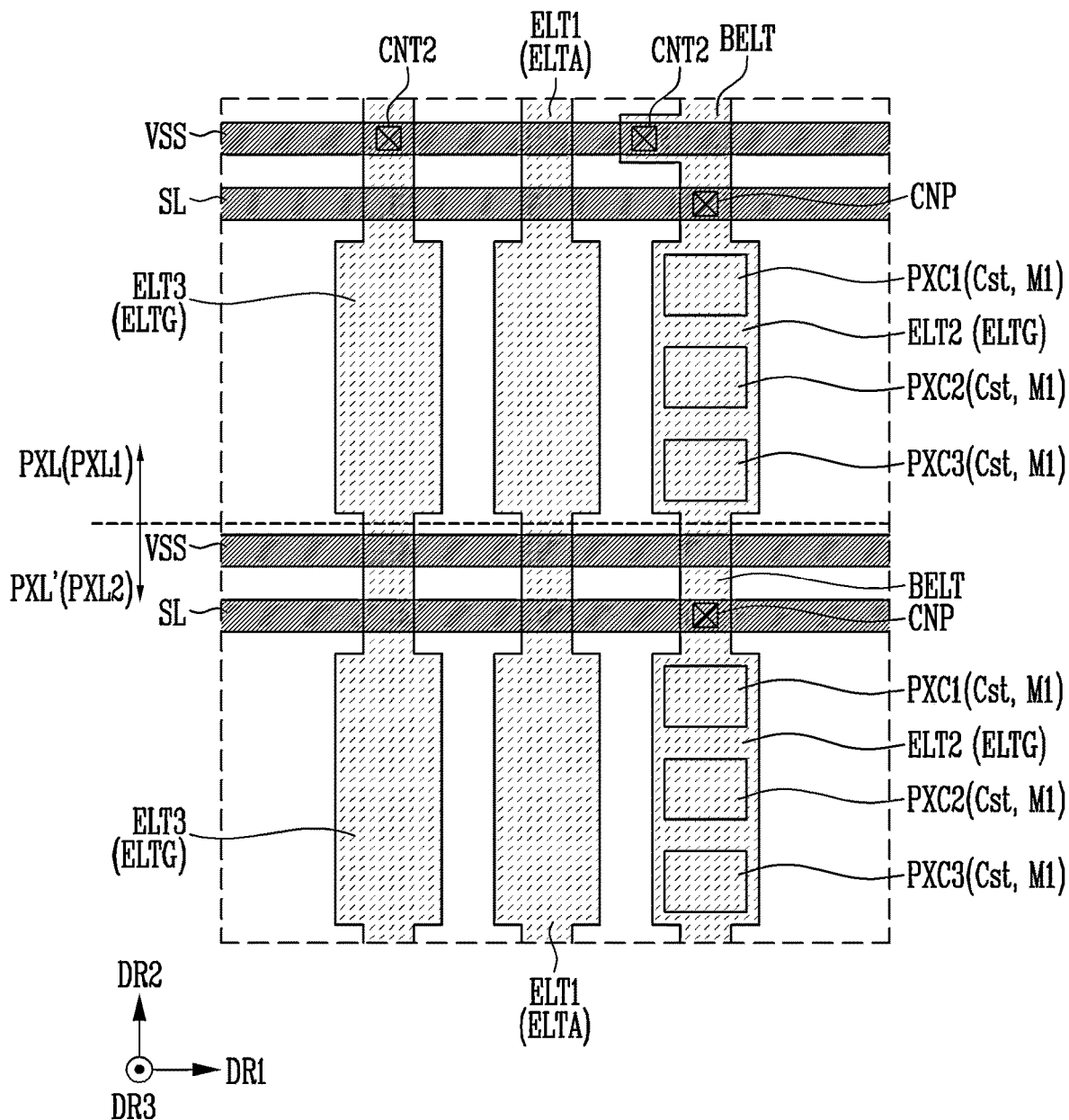

Referring to FIGS. 14 and 17, an alignment electrode layer ELT may be patterned on the base layer BSL. For example, a first alignment electrode ELTA and a second alignment electrode ELTG may be patterned on the base layer BSL.

A first bank BNK1 may be formed on the pixel circuit layer PCL, and the alignment electrode layer ELT may be patterned. A first insulating layer INS1 may be patterned such that the alignment electrode layer ELT is covered thereby.

Each of first to third electrodes ELT1, ELT2, and ELT3 may be patterned in the first pixel PXL1 and the second pixel PXL2. In embodiments, first electrodes ELT1 of each of the first pixel PXL1 and the second pixel PXL2 may be connected to each other. Second electrodes ELT2 of each of the first pixel PXL1 and the second pixel PXL2 may be connected to each other. Third electrodes ELT3 of each of the first pixel PXL1 and the second pixel PXL2 may be connected to each other.

The second electrode ELT2 disposed on the pixel circuits PXC may be electrically connected to the scan line through a scan contact part CNP.

Second alignment electrodes ELTG may be electrically connected to the second power line VSS through a second contact part CNT2. Although not shown in these drawings, first alignment electrodes ELTA may be electrically connected to the first power line VDD through a first contact part CNT1.

In accordance with an embodiment, the second alignment electrode ELTG (e.g., the second electrode ELT2) may be electrically connected to the second power line VSS and the scan line SL.

Figure 15:
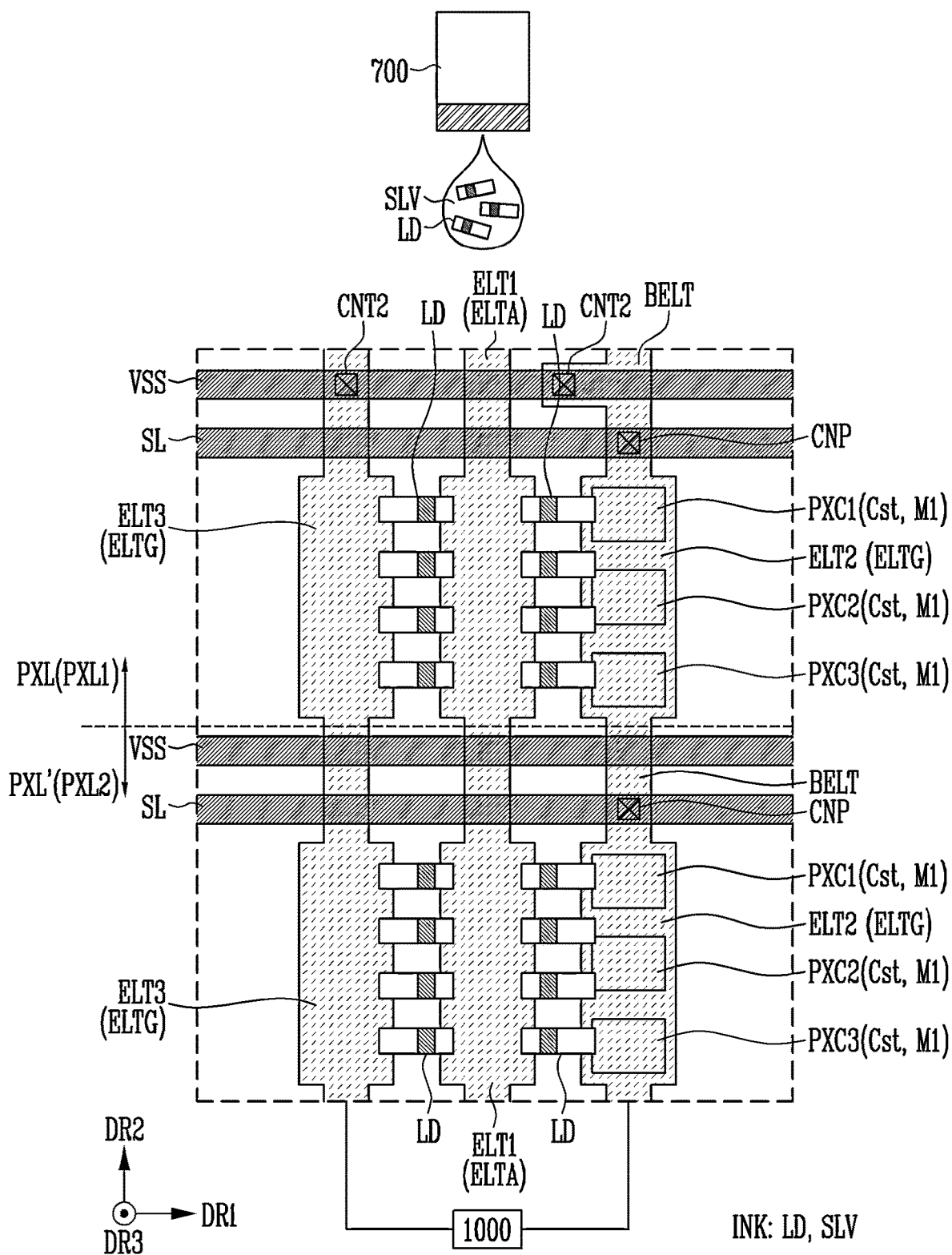

Referring to FIGS. 15 and 18, an ink INK may be supplied (or sprayed) onto the base layer BSL. Light emitting elements LD may be aligned between the alignment electrodes ELTA and ELTG. The ink INK may be provided by a printing apparatus 700 which can spray a fluid.

In accordance with an embodiment, the printing apparatus 700 may include a nozzle device that releases a liquid fluid. The ink INK in the specification may be a liquid mixture which can be released by the printing apparatus 700.

The printing apparatus 700 may spray the ink INK onto an area in which the light emitting elements LD are to be arranged while moving in the first direction DR1 and the second direction DR2.

In accordance with an embodiment, the ink INK may include a solvent SLV and a light emitting element LD. The light emitting element LD may be provided in plural, and may be provided as dispersed in the solvent SLV having fluidity. For example, in embodiments, the solvent SLV may have a fluidic property, and accordingly, the light emitting element LD may be dispersed in the solvent SLV. The solvent SLV may be a liquid-phase material, instead of a solid-phase material, in which the light emitting elements LD are dispersed and provided. In embodiments, the solvent SLV may include an organic solvent. For example, the solvent SLV may be at least one selected from the group consisting of Propylene Glycol Methyl Ether Acetate (PG-MEA), Dipropylene Glycol n-Propyl Ether (DGPE), and triethylene Glycol n-Butyl Ether (TGBE). However, the disclosure is not limited to the above-described example, and the solvent SLV may include various organic solvents.

A probe device 1000 may form an electric field by providing electrical signals to the first alignment electrode ELTA and the second alignment electrode ELTG. The probe device 1000 may provide alignment signals respectively to the first alignment electrode ELTA and the second alignment electrode ELTG. For example, an electrical signal (e.g., an alignment signal) may be provided to the first alignment electrode ELTA and the second alignment electrode ELTG, so that an electric field is formed in an area in which the light emitting element LD is to be aligned. For example, a first alignment signal may be provided to the first alignment electrode ELTA, and a second alignment signal may be provided to the second alignment electrode ELTG. An electric field based on the first alignment signal and the second alignment signal may be formed in the area in which the light emitting element LD is to be aligned.

The first alignment signal may be an AC signal, and the second alignment signal may be a ground signal. However, the disclosure is not necessarily limited to the above-described example. The AC signal may be one of a sine wave, a triangular wave, a square wave, a trapezoidal wave, and a pulse wave. However, the disclosure is not limited thereto, and the AC signal may have various AC signal forms.

In accordance with an embodiment, the light emitting elements LD may be moved (or rotated) by a force (a DEP force) according to the electric field, to be aligned (or disposed) on the first insulating layer INS1.

Figure 16:
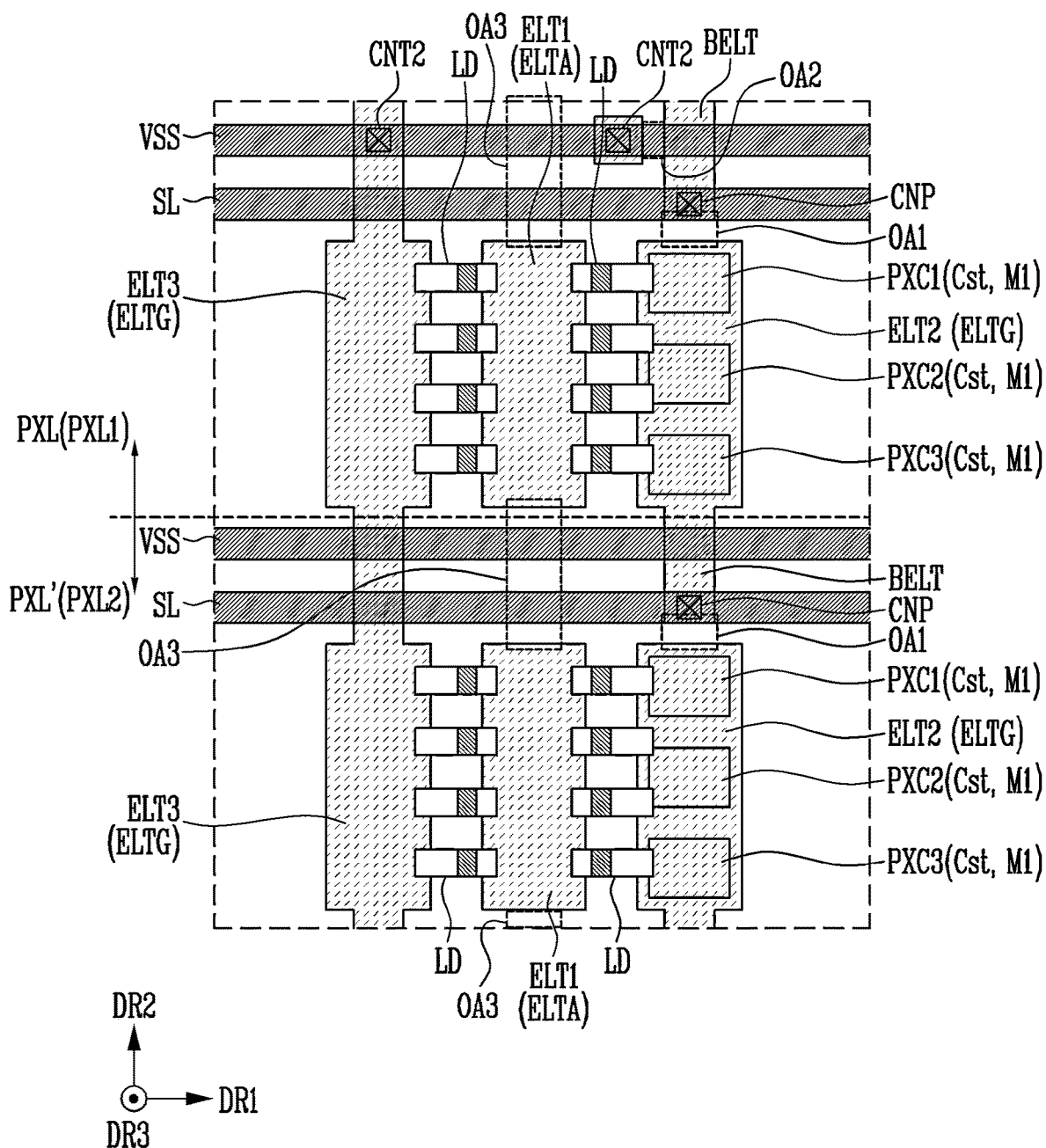

Referring to FIG. 16, a portion of the alignment electrode layer ELT may be removed (or etched).

An extension electrode pattern BELT may be separated from an adjacent second electrode ELT2 in a first open area OA1. For example, an extension electrode pattern BELT of the first pixel PXL1 may be separated from the second electrode ELT2 of the second pixel PXL2. As described above, the extension electrode pattern BELT may be electrically connected to the scan line SL of the second pixel PXL2 through the scan contact part CNP. Accordingly, a scan signal of the second pixel PXL2 may be supplied to the second electrode ELT2 of the first pixel PXL1 without supplying any power from the second power line VSS to the second electrode ELT2 of the first pixel PXL1.

A portion of the alignment electrode layer ELT electrically connected to the second power line VSS may be separated from the extension electrode pattern BELT in a second open area OA2. Accordingly, any electrical signal supplied by the second power line VSS may not be applied to the second electrode ELT2.

Portions of the first alignment electrodes ELTA may be etched in a third open area OA3, thereby separating the first electrode ELT1 of the first pixel PXL1 and the first electrode ELT1 of the second pixel PXL2 from each other. Accordingly, the first pixel PXL1 and the second pixel PXL2 may be individually driven.

Referring to FIG. 19, a second insulating layer INS2 may be patterned on the light emitting element LD, a connection electrode layer CNE may be patterned, and a third insulating layer INS3 may be patterned.

The second insulating layer INS2 may cover an active layer AL of the light emitting element LD, and expose a first end portion EP1 and a second end portion EP2 of the light emitting element LD.

An anode connection electrode AE may be electrically connected to the first end portion EP1 of the light emitting element LD, and a cathode connection electrode CE may be electrically connected to the second end portion EP2 of the light emitting element LD. The third insulating layer INS3 may be patterned, to cover the connection electrode layer CNE.

Although not shown in the drawing, a color conversion layer CCL, a color filter layer CFL, and the like may be disposed, thereby providing the display device 100 in accordance with the embodiment of the disclosure.

In accordance with the disclosure, there can be provided a display device and a manufacturing method of the same, in which the reliability of electrical signals is improved in the display device.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:
    pixels disposed on a base layer, each of the pixels including electrodes and a light emitting element disposed on the electrodes; and
    scan lines that supply a scan signal to the pixels, wherein the pixels comprise a first pixel and a second pixel disposed adjacent to the first pixel,
    the scan lines include:
        a first pixel scan line that supplies a first scan signal to the first pixel; and
        a second pixel scan line that supplies a second scan signal to the second pixel,
    the electrodes include a first electrode and a second electrode, which are spaced from each other, and
    the second pixel scan line is directly electrically connected to a second electrode of the first pixel.

2. The display device of claim 1, wherein the light emitting element is aligned between the first electrode and the second electrode.

3. The display device of claim 1, further comprising:
    a first power line that supplies a first power to the light emitting element; and
    a second power line that supplies a second power different from the first power to the light emitting element,
    wherein the second power line is not directly electrically connected to any of the first electrode or the second electrode.

4. The display device of claim 3, wherein
    the electrodes further include a third electrode,
    the second electrode is disposed on a side of the first electrode,
    the third electrode is disposed on another side of the first electrode,
    the second power line supplies the second power to the third electrode, and
    the second power line does not supply the second power to the second electrode.

5. The display device of claim 1, wherein
    each of the pixels further includes a pixel circuit including a driving transistor, and
    the second electrode overlaps a gate electrode of the driving transistor in a plan view.

6. The display device of claim 5, wherein the second electrode entirely covers the gate electrode of the driving transistor.

7. The display device of claim 5, wherein
    the driving transistor includes an active layer,
    the active layer includes a non-covering active layer not overlapping the gate electrode of the driving transistor in a plan view, and
    the second electrode overlaps the non-covering active layer in a plan view.

8. The display device of claim 5, wherein the pixel circuit further includes a storage capacitor including a first capacitor electrode and a second capacitor electrode, and
    the second electrode overlaps the first capacitor electrode and the second capacitor electrode in a plan view.

9. The display device of claim 8, wherein the second electrode entirely covers the first capacitor electrode and the second capacitor electrode.

10. The display device of claim 1, wherein
    the electrodes further include an extension electrode pattern integrally formed with the second electrode, and an extension electrode pattern of the first pixel is directly electrically connected to the second pixel scan line through a scan contact part, and is physically separated from a second electrode of the second pixel.

11. The display device of claim 10, wherein the extension electrode pattern and the electrodes extend in a same direction.

12. The display device of claim 1, wherein each of the pixels further includes:
    an anode connection electrode electrically connected to a first end portion of the light emitting element; and
    a cathode connection electrode electrically connected to a second end portion of the light emitting element.

13. The display device of claim 1, wherein
    each of the pixels further includes a pixel circuit including a driving transistor, and
    a source electrode, a drain electrode, and a gate electrode of the driving transistor are disposed in a same layer.

14. The display device of claim 1, further comprising:
    a first power line that supplies a first power to the light emitting element; and
    a second power line that supplies a second power different from the first power to the light emitting element, wherein
    the electrodes further include a third electrode, and
    the second power line supplies the second power to the third electrode and not to any of the first electrode or the second electrode.

15. The display device of claim 1, further comprising:
    a first power line that supplies a first power to the light emitting element; and
    a second power line that supplies a second power different from the first power to the light emitting element, wherein
    the electrodes further include a third electrode, and
    the second power line is directly electrically connected to the third electrode and not directly electrically connected to any of the first electrode or the second electrode.

16. A method for manufacturing a display device including a first pixel and a second pixel disposed adjacent to the first pixel, the method comprising:
    patterning, on a base layer, a pixel circuit, a scan line, and a power line, the pixel circuit including a driving transistor and the power line including a first power line and a second power line;
    patterning an alignment electrode layer on the base layer; and
    disposing light emitting elements on the alignment electrode layer, wherein
    the patterning of the alignment electrode layer includes forming a first electrode and a second electrode spaced apart from the first electrode in a first direction, and
    a second electrode of the first pixel is directly electrically connected to a scan line of the second pixel.

17. The method of claim 16, wherein the patterning of the alignment electrode layer further includes:
    electrically connecting the second electrode of the first pixel to the scan line of the second pixel; and
    electrically connecting the second electrode of the first pixel to the second power line.

18. The method of claim 17, wherein the patterning of the alignment electrode layer further includes covering, by the second electrode, a gate electrode of the driving transistor.

19. The method of claim 18, wherein
    the driving transistor includes an active layer, the active layer includes a non-covering active layer not overlapping the gate electrode of the driving transistor in a plan view, and the patterning of the alignment electrode layer further includes covering, by the second electrode, the non-covering active layer.

20. The method of claim 17, further comprising removing a portion of the alignment electrode layer, wherein the removing of the portion of the alignment electrode layer includes electrically separating the second electrode and the second power line from each other.

21. The method of claim 17, wherein the second electrode of the first pixel is electrically connected to the scan line of the second pixel through an extension electrode pattern of the first pixel, the method further comprises removing a portion of the alignment electrode layer, and the removing of the portion of the alignment electrode layer includes electrically separating the extension electrode pattern of the first pixel and a second electrode of the second pixel from each other.

22. The method of claim 16, wherein the disposing of the light emitting elements includes:

supplying an alignment signal to the alignment electrode layer; and aligning the light emitting elements, based on an electric field formed by the alignment signal.

\* \* \* \* \*